(12) United States Patent
Kim et al.

(10) Patent No.: US 11,120,735 B2
(45) Date of Patent: Sep. 14, 2021

(54) LIGHT EMITTING DEVICE PACKAGE AND DISPLAY DEVICE INCLUDING THE SAME

(71) Applicant: SAMSUNG ELECTRONICS CO., LTD., Suwon-si (KR)

(72) Inventors: Kyoungjun Kim, Yongin-si (KR); Dongsoo Lim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/800,023

(22) Filed: Feb. 25, 2020

(65) Prior Publication Data

US 2021/0065614 A1    Mar. 4, 2021

(30) Foreign Application Priority Data

Aug. 27, 2019 (KR) .......................... 10-2019-0105069

(51) Int. Cl.
  *G09G 3/32* (2016.01)
  *H01L 33/62* (2010.01)
  *G09G 3/34* (2006.01)
  *H01L 23/60* (2006.01)
  *H01L 25/16* (2006.01)
  *H01L 25/075* (2006.01)

(52) U.S. Cl.
  CPC .............. *G09G 3/32* (2013.01); *H01L 33/62* (2013.01); *G09G 2300/08* (2013.01); *G09G 2310/08* (2013.01); *G09G 2320/064* (2013.01); *G09G 2330/04* (2013.01)

(58) Field of Classification Search
  USPC ........................................................ 345/691
  See application file for complete search history.

(56) References Cited

U.S. PATENT DOCUMENTS

| 8,094,102 | B2 | 1/2012 | Huang | |
|---|---|---|---|---|
| 8,916,902 | B2 | 12/2014 | Hsue | |
| 9,635,721 | B2 | 4/2017 | Huang | |
| 2003/0141807 | A1* | 7/2003 | Kawase | H01L 27/3262 313/498 |
| 2004/0196275 | A1* | 10/2004 | Hattori | G09G 3/3283 345/204 |
| 2006/0001613 | A1* | 1/2006 | Routley | G09G 3/3216 345/76 |
| 2007/0295975 | A1 | 12/2007 | Omae | |

(Continued)

FOREIGN PATENT DOCUMENTS

KR    10-2019-0004608 A    1/2019
KR    10-1971979 B1    4/2019

*Primary Examiner* — Chineyere D Wills-Burns
(74) *Attorney, Agent, or Firm* — Lee IP Law, PC

(57) ABSTRACT

A light emitting device package includes a first light emitting diode pixel, the first light emitting diode pixel including first light emitting diode chips that each emit light, and a first pixel driving integrated circuit under the first light emitting diode chips of the first light emitting diode pixel, the first pixel driving integrated circuit configured to drive the first light emitting diode chips based on an active matrix scheme, in which each of the first light emitting diode chips is driven using an entire one frame interval, and based on a pulse width modulation scheme, in which a time during which each of first driving currents is applied to a respective one of the first light emitting diode chips is controlled within the entire one frame interval.

19 Claims, 36 Drawing Sheets

(56) References Cited

U.S. PATENT DOCUMENTS

| | | | | |
|---|---|---|---|---|
| 2010/0182225 | A1* | 7/2010 | Huang | G09G 3/32 345/83 |
| 2012/0187856 | A1* | 7/2012 | Huang | H01L 25/167 315/210 |
| 2014/0312378 | A1* | 10/2014 | Hsue | H01L 27/15 257/99 |
| 2015/0186098 | A1* | 7/2015 | Hall | H05K 5/0017 345/1.3 |
| 2017/0064784 | A1* | 3/2017 | Huang | H05B 45/00 |
| 2017/0150582 | A1* | 5/2017 | Clout | H05B 45/325 |
| 2017/0330509 | A1* | 11/2017 | Cok | G09G 3/2014 |
| 2018/0261149 | A1* | 9/2018 | Lin | H01L 25/0753 |
| 2020/0161287 | A1* | 5/2020 | Yoo | G09F 9/301 |

* cited by examiner

LIGHT EMITTING DEVICE PACKAGE AND DISPLAY DEVICE INCLUDING THE SAME

CROSS-REFERENCE TO RELATED APPLICATION

Korean Patent Application No. 10-2019-0105069, filed on Aug. 27, 2019, in the Korean Intellectual Property Office, and entitled: "Light Emitting Device Package and Display Device Including the Same," is incorporated by reference herein in its entirety.

BACKGROUND

1. Field

Example embodiments relate generally to semiconductor integrated circuits, and more particularly to light emitting device packages and display devices including the light emitting device packages.

2. Description of the Related Art

Liquid crystal display devices may include a liquid crystal display (LCD) and a backlight. Other display devices do not require separate backlights.

SUMMARY

Embodiments are directed to a light emitting device package, including a first light emitting diode pixel and a first pixel driving integrated circuit. The first light emitting diode pixel includes first light emitting diode chips each of which emits light. The first pixel driving integrated circuit is disposed under the first light emitting diode chips of the first light emitting diode pixel, and drives the first light emitting diode chips based on an active matrix (AM) scheme in which each of the first light emitting diode chips is driven using an entire one frame interval and based on a pulse width modulation (PWM) scheme in which a time during which each of first driving currents is applied to a respective one of the first light emitting diode chips is controlled within the entire one frame interval.

Embodiments are also directed to a display device, including a printed circuit board (PCB), a plurality of light emitting device packages and a controller. The plurality of light emitting device packages are disposed on a first surface of the printed circuit board. The controller is disposed on a second surface of the printed circuit board opposite to the first surface of the printed circuit board, and controls driving of the plurality of light emitting device packages. Each of the plurality of light emitting device packages includes a first light emitting diode pixel and a first pixel driving integrated circuit. The first light emitting diode pixel includes first light emitting diode chips each of which emits light. The first pixel driving integrated circuit is disposed under the first light emitting diode chips of the first light emitting diode pixel, and drives the first light emitting diode chips based on an active matrix (AM) scheme in which each of the first light emitting diode chips is driven using an entire one frame interval and based on a pulse width modulation (PWM) scheme in which a time during which each of first driving currents is applied to a respective one of the first light emitting diode chips is controlled within the entire one frame interval.

Embodiments are also directed to a light emitting device package, including a first light emitting diode pixel, a first pixel driving integrated circuit and a package substrate. The first light emitting diode pixel includes first light emitting diode chips each of which emits light. The first pixel driving integrated circuit is disposed under the first light emitting diode chips of the first light emitting diode pixel, and drives the first light emitting diode chips based on an active matrix (AM) scheme in which each of the first light emitting diode chips is driven using an entire one frame interval and based on a pulse width modulation (PWM) scheme in which a time during which each of first driving currents is applied to a respective one of the first light emitting diode chips is controlled within the entire one frame interval. The first light emitting diode chips and the first pixel driving integrated circuit are mounted on the package substrate. The first pixel driving integrated circuit includes a demultiplexer, a storage, a constant current generator, a pulse width modulation data generator, a data input pad, a data output pad, a power pad, a first clock pad, a second clock pad and a ground pad. The demultiplexer receives serial data from an external controller, extracts first frame data for the first light emitting diode chips from the serial data to store the first frame data, and distributes the first frame data to output the distributed first frame data. The storage stores the distributed first frame data. The constant current generator generates a reference current based on a power supply voltage. The pulse width modulation data generator generates the first driving currents applied to the first light emitting diode chips based on a clock signal, a pulse width modulation clock signal, the distributed first frame data provided from the storage, and the reference current provided from the constant current generator. The data input pad receives the serial data. The data output pad outputs remaining data other than the first frame data among the serial data. The power pad receives the power supply voltage. The first clock pad receives the clock signal. The second clock pad receives the pulse width modulation clock signal. The ground pad is connected to the first light emitting diode chips. The first light emitting diode chips and the first pixel driving integrated circuit are directly connected through at least one electrode. The first pixel driving integrated circuit and the package substrate are connected through at least one bonding wire.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
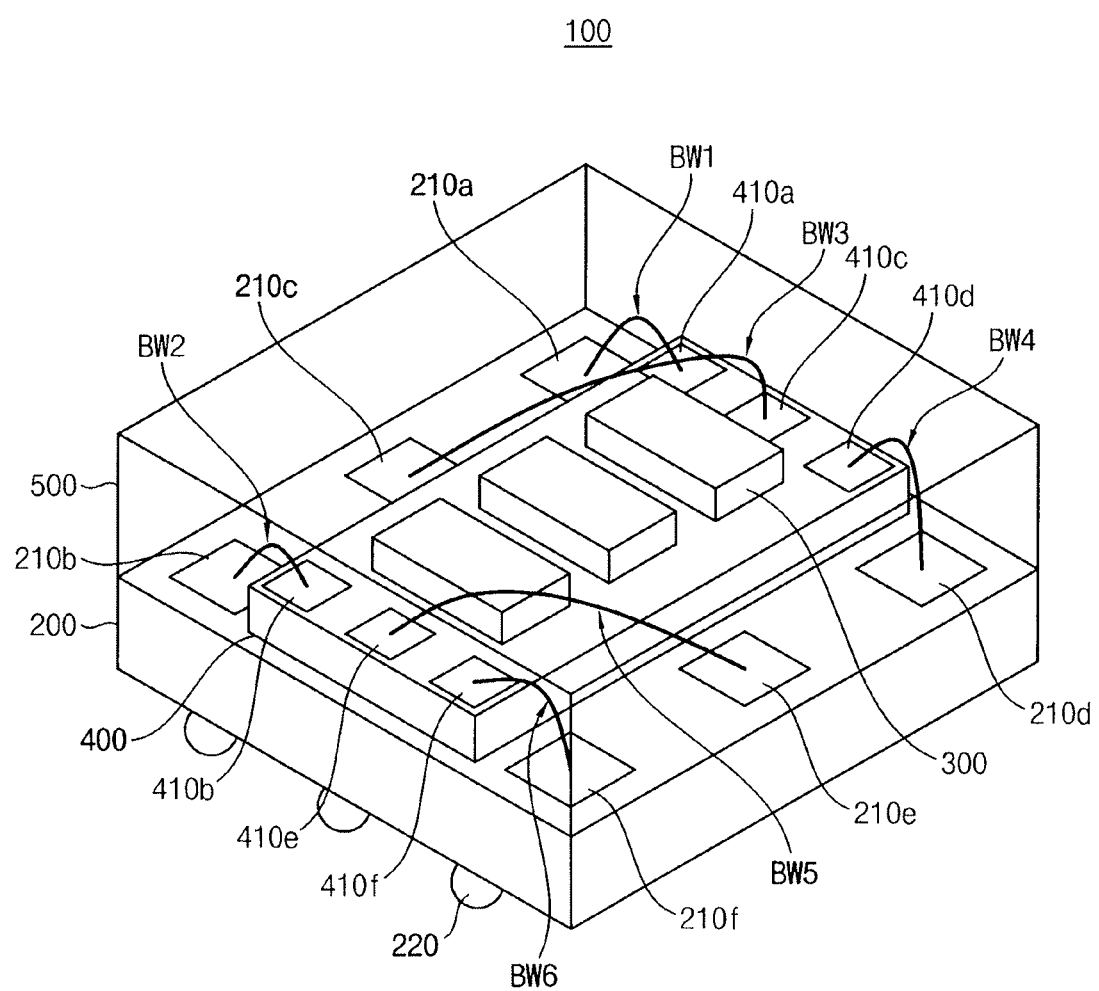
FIG. 1 illustrates a perspective view of a light emitting device package according to an example embodiment.
Figure 2A:
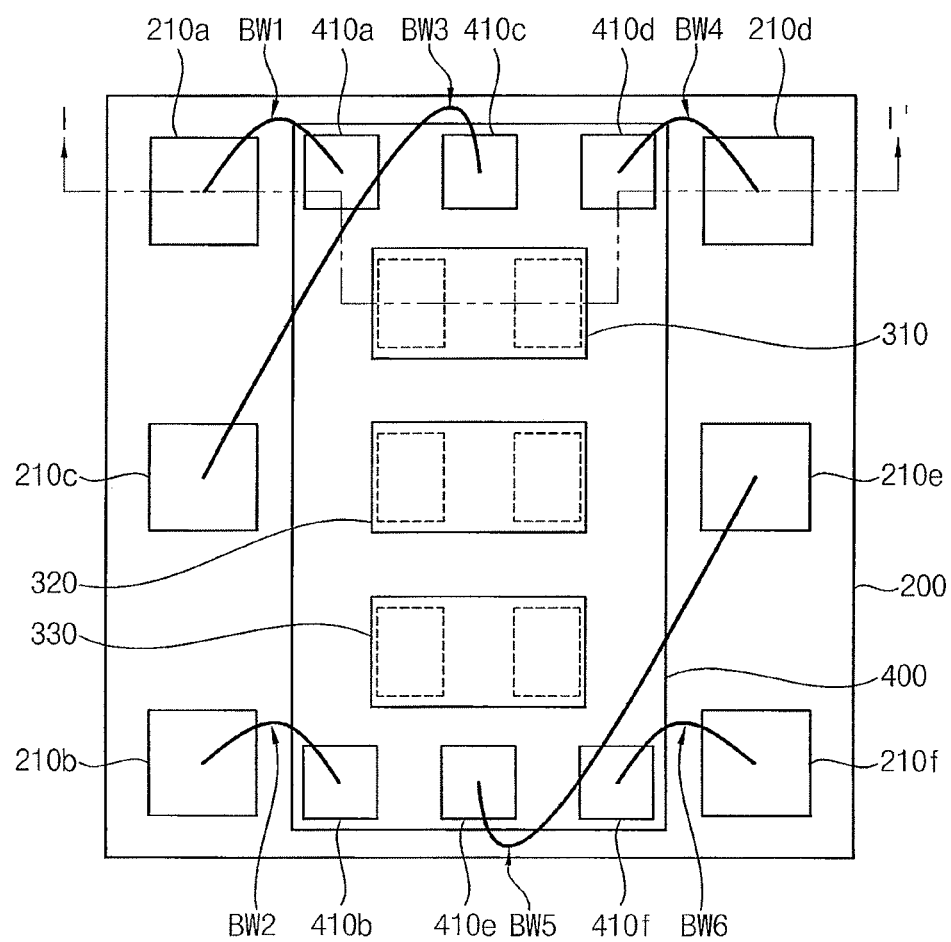
FIGS. 2A and 2B illustrate a plan view and a cross-sectional view of a light emitting device package of FIG. 1.
Figure 2B:
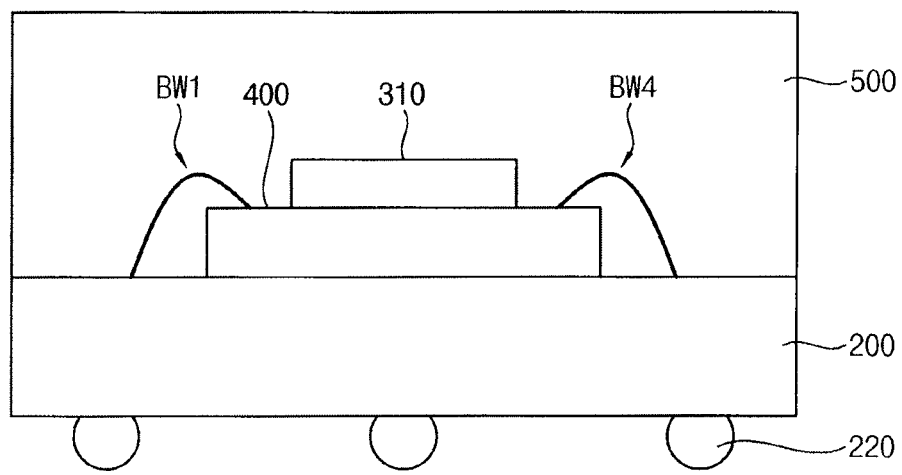

FIG. 1 is a perspective view of a light emitting device package according to an example embodiment. FIGS. 2A and 2B are a plan view and a cross-sectional view of a light emitting device package of FIG. 1. FIG. 2B illustrates an example of the light emitting device package taken along a line I-I' of FIG. 2A.

Referring to FIGS. 1, 2A and 2B, a light emitting device package 100 may include a light emitting diode (LED) pixel and a pixel driving integrated circuit (IC) 400. The light emitting device package 100 may further include a package substrate 200, a sealing member 500, and a plurality of bonding wires BW1, BW2, BW3, BW4, BW5, and BW6.

The light emitting diode pixel may include a plurality of light emitting diode chips 300, each of which emits light. The light emitting diode chips 300 may include, for example, a first light emitting diode chip 310, a second light emitting diode chip 320 and a third light emitting diode chip 330. FIG. 1 illustrates an example where one light emitting diode pixel includes three light emitting diode chips 300. In another example embodiment, the number of light emitting diode chips included in one light emitting diode pixel may be different.

In an example embodiment, the light emitting diode chips 300 may respectively emit light of different colors. For example, the first light emitting diode chip 310 may be a red light emitting diode chip that emits red light, the second light emitting diode chip 320 may be a green light emitting diode chip that emits green light, and the third light emitting diode chip 330 may be a blue light emitting diode chip that emits blue light. In this example embodiment, the light emitting device package 100 may be implemented in the form of a RGB package for full colors.

In another example embodiment, the light emitting diode chips 300 may each emit light of a same color. For example, each of the first, second, and third light emitting diode chips 310, 320, and 330 may emit white light. In this example embodiment, the light emitting device package 100 may be implemented in the form of a multi-white package for vivid colors.

In another example embodiment, the color of the light emitted from the light emitting diode chips 300 may be cyan, yellow, magenta, black or UV, or the like.

The pixel driving integrated circuit 400 may be disposed under the light emitting diode chips 300 of the light emitting diode pixel, for example, the pixel driving integrated circuit 400 may be between the substrate 200 and the light emitting diode chips 300. By locating the pixel driving integrated circuit 400 under the light emitting diode chips 300, the light emitted from the light emitting diode chips 300 may not be blocked by the pixel driving integrated circuit 400.

The pixel driving integrated circuit 400 may drive the light emitting diode chips 300 based on an active matrix (AM) scheme and a pulse width modulation (PWM) scheme.

The active matrix scheme may be a driving scheme in which each of the light emitting diode chips 300 included in one light emitting diode pixel is driven using (or during) an entire one frame interval (or frame period). The active matrix scheme may be different from and distinguished from a passive matrix (PM) scheme in which one frame interval is divided into a plurality of sub-intervals, and each of light emitting diode chips included in one light emitting diode pixel is driven using only some sub-intervals.

The pulse width modulation scheme may be a driving scheme in which a time during which each of driving currents is applied to a respective one of the light emitting diode chips 300 is controlled within the entire one frame interval. The pulse width modulation scheme may be different from and distinguished from a pulse amplitude modulation (PAM) scheme in which a current level (or magnitude) of each of driving currents applied to a respective one of light emitting diode chips is controlled.

Detailed configurations and operations of the pixel driving integrated circuit 400 for implementing the active matrix scheme and the pulse width modulation scheme will be described with reference to FIGS. 1 and 3 through 16.

As shown in FIG. 1, the pixel driving integrated circuit 400 may include a plurality of pads 410a, 410b, 410c, 410d, 410e and 410f for electrical connection with the package substrate 200. For example, the plurality of pads 410a-410f may include a data input pad 410a, a data output pad 410b, a power pad 410c, a first clock pad 410d, a second clock pad 410e, and a ground pad 410f, and may be referred to as IC pads. For example, a pad may be a contact pad or a contact pin.

In the example embodiment illustrated in FIG. 1, the light emitting diode chips 300 may be implemented in the form of flip chips. For example, the light emitting diode chips 300 and the pixel driving integrated circuit 400 may be directly connected through at least one electrode. In FIG. 2A, rectangles illustrated by dotted lines in the first, second, and third light emitting diode chips 310, 320, and 330 may represent the at least one electrode. Although not illustrated in detail, at least one pad for electrical connection with the light emitting diode chips 300 may be further disposed on the pixel driving integrated circuit 400 under the light emitting diode chips 300. In addition, although not illustrated, a conductive bonding material such as eutectic metal, paste, solder, or the like, may be formed between the light emitting diode chips 300 and the pixel driving integrated circuit 400 to electrically connect the light emitting diode chips 300 with the pixel driving integrated circuit 400.

The package substrate 200 may be disposed under the pixel driving integrated circuit 400. The light emitting diode chips 300 of the light emitting diode pixel and the pixel driving integrated circuit 400 may be mounted on the package substrate 200. The light emitting diode chips 300 and the pixel driving integrated circuit 400 may be electrically connected to an external printed circuit board (PCB) (for example, a printed circuit board 2300 in FIG. 27) and an external controller (for example, a controller 2400 in FIG. 27) via the package substrate 200, and may communicate with the external controller via the package substrate 200.

The package substrate 200 may include a plurality of pads 210a, 210b, 210c, 210d, 210e, and 210f for electrical connection with the pixel driving integrated circuit 400. For example, the plurality of pads 210a-210f may include a data input pad 210a, a data output pad 210b, a power pad 210c, a first clock pad 210d, a second clock pad 210e, and a ground pad 210f, and may be referred to as package pads.

The plurality of bonding wires BW1~BW6 may electrically connect the plurality of pads 410a-410f of the pixel driving integrated circuit 400 with the plurality of pads 210a-210f of the package substrate 200, respectively, and may be referred to as package bonding wires. For example, the bonding wire BW1 may electrically connect the data input pad 410a with the data input pad 210a, the bonding wire BW2 may electrically connect the data output pad 410b with the data output pad 210b, the bonding wire BW3 may electrically connect the power pad 410c with the power pad 210c, the bonding wire BW4 may electrically connect the first clock pad 410d with the first clock pad 210d, the bonding wire BW5 may electrically connect the second clock pad 410e with the second clock pad 210e, and the bonding wire BW6 may electrically connect the ground pad 410f with the ground pad 210f.

Although not illustrated, an adhesive member such as epoxy, silicone, acrylate, paste, or the like, for fixing the pixel driving integrated circuit 400 may be interposed between the pixel driving integrated circuit 400 and the package substrate 200.

The package substrate 200 may include a plurality of conductive bumps 220 formed on a lower surface of the package substrate 200 for electrical connection with, for example, an external printed circuit board. Although not illustrated in detail, wires and/or vias for electrically connecting the plurality of pads 210a-210f with the plurality of conductive bumps 220 may be formed in the package substrate 200.

The light emitting diode chips 300 of the light emitting diode pixel, the pixel driving integrated circuit 400 and the plurality of bonding wires BW1-BW6 may be fixed by the sealing member 500. For example, epoxy resin, silicone resin, or the like, may be used as the sealing member 500, and/or resin containing fillers such as fused silica, carbon black, or the like, may be used as the sealing member 500.

In an example embodiment, when manufacturing the light emitting device package 100 of FIG. 1, the package substrate 200 may be prepared or provided, the pixel driving integrated circuit 400 may be attached to the package substrate 200 using the adhesive member, the light emitting diode chips 300 may be bonded on the pixel driving integrated circuit 400 using the conductive adhesive material, the plurality of bonding wires BW 1-BW6 may be formed, a package may be molded with the sealing member 500, and a single package may be obtained by sawing or singulating the molded package.

In the light emitting device package 100 according to an example embodiment, the pixel driving integrated circuit 400 for driving the light emitting diode chips 300 based on the active matrix scheme and the pulse width modulation scheme may be included in each package. Thus, the active matrix scheme may be efficiently implemented, and the ghost and flicker, which may arise in the passive matrix scheme, may be effectively reduced and/or removed. In addition, by disposing the pixel driving integrated circuit 400 under the light emitting diode chips 300, the light emitted from the light emitting diode chips 300 may not be blocked by the pixel driving integrated circuit 400, thereby preventing a decrease in luminous efficiency or emission efficiency.

Figure 3:
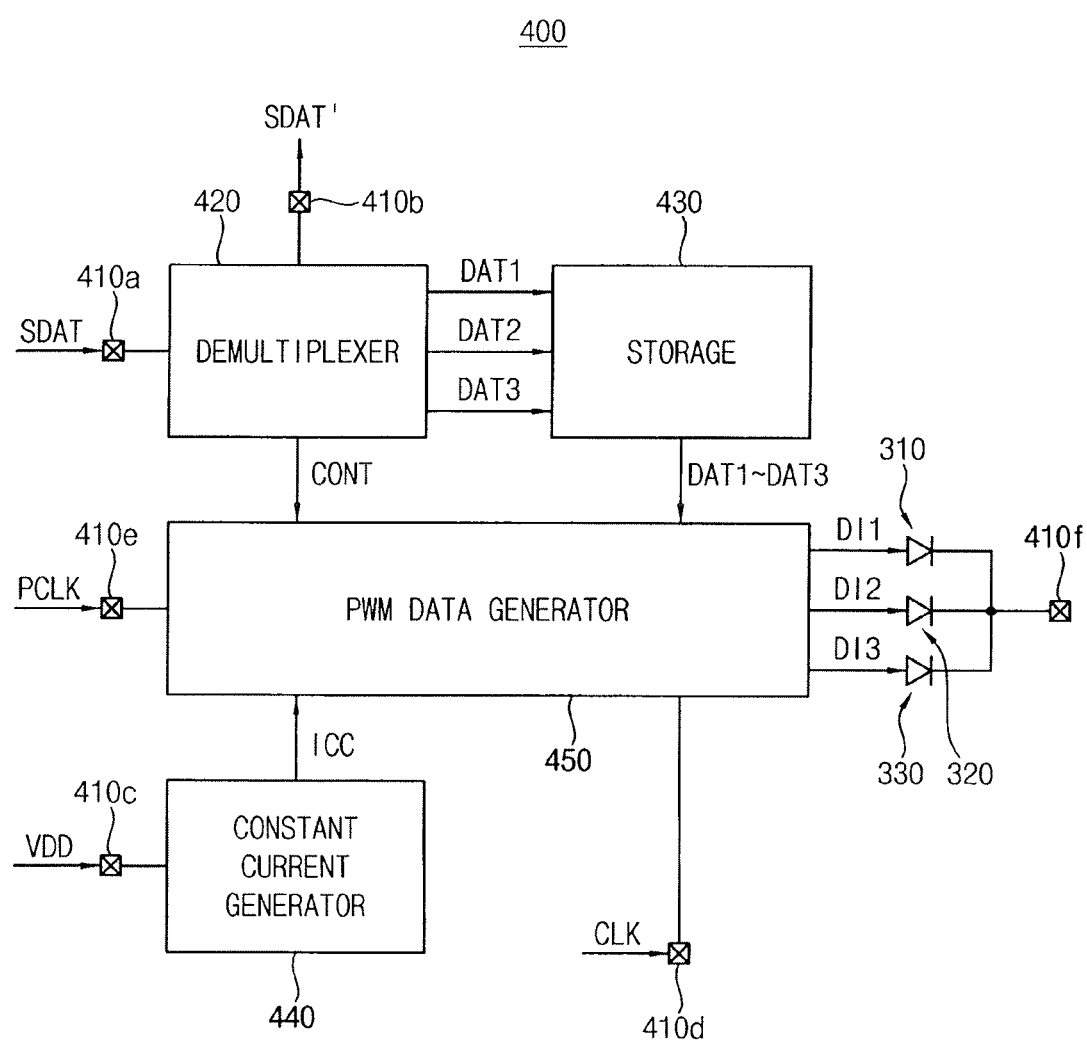
FIG. 3 illustrates a block diagram illustrating an example of a pixel driving integrated circuit included in a light emitting device package according to an example embodiment.

FIG. 3 is a block diagram illustrating an example of a pixel driving integrated circuit included in a light emitting device package according to an example embodiment.

Referring to FIG. 3, the pixel driving integrated circuit 400 may include the plurality of pads 410a-410f, a demultiplexer 420, a storage 430, a constant current generator 440, and a pulse width modulation data generator 450. The plurality of pads 410a-410f in FIG. 3 may be substantially the same as the plurality of pads 410a-410f described with reference to FIG. 1.

The demultiplexer 420 may receive serial data SDAT from an external controller (for example, the controller 2400 in FIG. 27) via the data input pad 410a, may extract first frame data for the light emitting diode chips 310, 320, and 330 from the serial data SDAT to store the first frame data, and may distribute the first frame data to output the distributed first frame data. The demultiplexer 420 may include, for example, a shift register for temporarily storing the first frame data and a distributor or divider for distributing the first frame data.

In an example embodiment, the first frame data may include driving data DAT1, DAT2, and DAT3 for the light emitting diode chips 310, 320, and 330, and control data CONT for controlling the pulse width modulation data generator 450. For example, the driving data DAT1, DAT2, and DAT3 may include grayscale data, and may further include additional grayscale data for overcoming low efficiency, wavelength shift, and the like.

In addition, the demultiplexer 420 may output remaining data SDAT' other than the first frame data among the serial data SDAT without any additional processing, and the remaining data SDAT' may be output via the data output pad 410b and may be provided to a light emitting device package at a next or later stage. As will be described with reference to FIG. 27, a plurality of light emitting device packages may be connected in series in a complete product (for example, in a display device). For example, when N light emitting device packages are connected in series, where N is a natural number greater than or equal to two, the serial data SDAT for one frame interval may include frame data of first through N-th light emitting device packages. The first light emitting device package may obtain and/or extract only frame data for itself and may output remaining data to the second light emitting device package, and the second light emitting device package may also obtain and/or extract only frame data for itself and may output remaining data to the third light emitting device package. In this manner, each of the first through N-th light emitting device packages may obtain frame data for itself.

The storage 430 may store the distributed first frame data. For example, the storage 430 may store the driving data DAT1, DAT2, and DAT3 for the light emitting diode chips 310, 320, and 330 among the distributed first frame data.

In an example embodiment, the storage 430 may include a latch, a register, a buffer, or the like. In another example embodiment, the storage 430 may include at least one of a volatile memory such as a static random access memory (SRAM), a dynamic random access memory (DRAM), or the like, or a nonvolatile memory such as an electrically erasable programmable read only memory (EEPROM), a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), or the like.

The constant current generator 440 may receive a power supply voltage VDD via the power pad 410c and may generate a reference current ICC based on the power supply voltage VDD. For example, the constant current generator 440 may include a current mirror.

The pulse width modulation data generator 450 may generate driving currents DI1, DI2, and DI3 applied to the light emitting diode chips 310, 320, and 330 based on a clock signal CLK received via the first clock pad 410d, a pulse width modulation clock signal PCLK received via the second clock pad 410e, the distributed first frame data (for example, the control data CONT and the driving data DAT1, DAT2, and DAT3) provided from the demultiplexer 420 and the storage 430, and the reference current ICC provided from the constant current generator 440.

The driving currents DI1, DI2, and DI3 may be generated based on the pulse width modulation scheme. For example, a pulse width (for example, an application time) of the driving current DI1 applied to the light emitting diode chip 310 may be adjusted based on the driving data DAT1, a pulse width of the driving current DI2 applied to the light emitting diode chip 320 may be adjusted based on the driving data DAT2, and a pulse width of the driving current DI3 applied to the light emitting diode chip 330 may be adjusted based on the driving data DAT3, For example, the clock signal CLK for driving the pulse width modulation data generator 450 may have a first frequency, and the pulse width modulation clock signal PCLK for the pulse width modulation scheme may have a second frequency higher than the first frequency to precisely adjust the pulse widths of the driving currents DI1, DI2, and DI3.

Each of the light emitting diode chips 310, 320, and 330 may include an anode electrode receiving a respective one of the driving currents DI1, DI2, and DI3 from the pulse width modulation data generator 450, and a cathode electrode connected to the ground pad 410f.

Figure 4A:
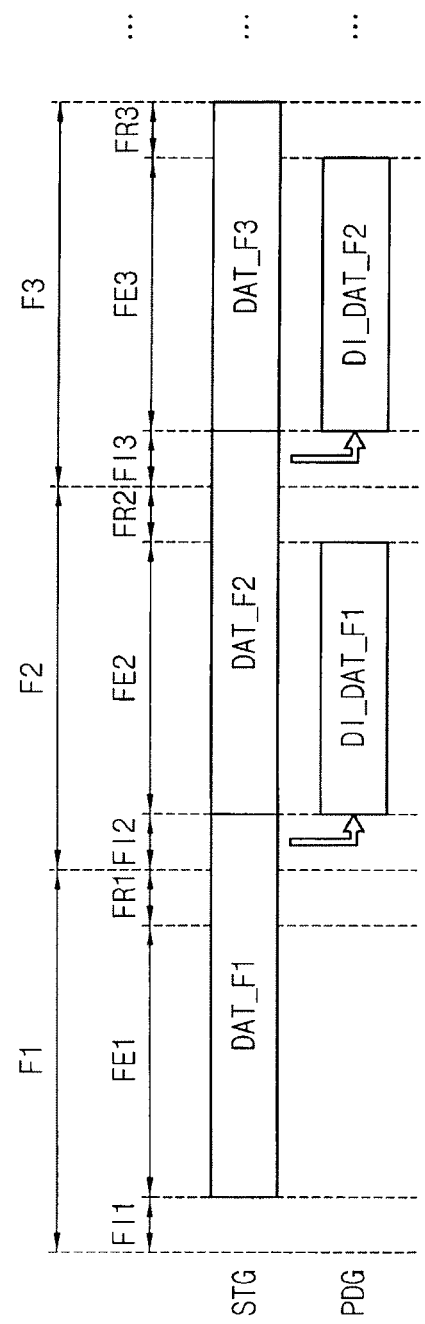
FIGS. 4A and 4B illustrate diagrams for describing an operation of the pixel driving integrated circuit of FIG. 3.
Figure 4B:
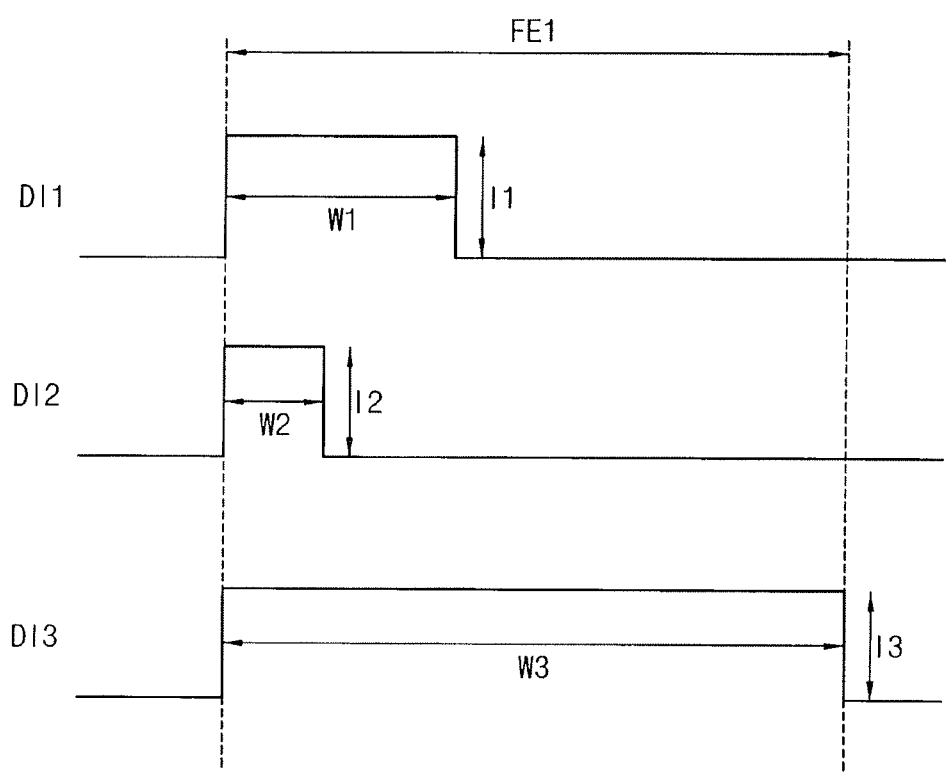

FIGS. 4A and 4B are diagrams for describing an operation of the pixel driving integrated circuit of FIG. 3.

Referring to FIGS. 3 and 4A, the pixel driving integrated circuit 400 may drive the light emitting diode chips 310, 320, and 330 based on the active matrix scheme in which each of the light emitting diode chips 310, 320, and 330 is driven using an entire one frame interval. In FIG. 4A, "STG" represents data stored in the storage 430 of FIG. 3, and "PDG" represents a driving current generated from the pulse width modulation data generator 450 of FIG. 3.

As illustrated in FIG. 4A, each frame interval may include an initial section, an emission section, and a reset section. For example, a first frame interval F1 may include a first initial section FI1, a first emission section FE1, and a first reset section FR1. A second frame interval F2 may include a second initial section FI2, a second emission section FE2, and a second reset section FR2. A third frame interval F3 may include a third initial section FI3, a third emission section FE3, and a third reset section FR3.

In the first frame interval F1, the pixel driving integrated circuit 400 may receive and distribute first frame data DAT_F1 during the first emission section FE1, and the storage 430 may store the first frame data DAT_F1. The first frame data DAT_F1 may be maintained in the storage 430 until the second initial section F12 of the second frame interval F2. In the first frame interval F1, the pulse width modulation data generator 450 may not generate a driving current, and thus the light emitting diode chips 310, 320, and 330 may not emit light.

In the second frame interval F2 subsequent to the first frame interval F1, the first frame data DAT_F1 stored in the storage 430 may be provided to the pulse width modulation data generator 450 during the second initial section F12, the pulse width modulation data generator 450 may generate a driving current DI_DAT_F1 based on the first frame data DAT_F1, and the light emitting diode chips 310, 320, and 330 may emit light based on the driving current DI_DAT_F1 during the second emission section FE2. Thus, a light emission operation of the current frame F2 may be performed based on the frame data DAT_F1 of the previous frame F1. In addition, the pixel driving integrated circuit 400 may receive and distribute second frame data DAT_F2 during the second emission section FE2, and the storage 430 may store the second frame data DAT_F2.

Similarly, in the third frame interval F3 subsequent to the second frame interval F2, the second frame data DAT_F2 stored in the storage 430 may be provided to the pulse width modulation data generator 450 during the third initial section FI3, the pulse width modulation data generator 450 may generate a driving current DI_DAT_F2 based on the second frame data DAT_F2, and the light emitting diode chips 310, 320, and 330 may emit light based on the driving current DI_DAT_F2 during the third emission section FE3. In addition, the pixel driving integrated circuit 400 may receive and distribute third frame data DAT_F3 during the third emission section FE3, and the storage 430 may store the third frame data DAT_F3.

In a general passive matrix scheme, when N light emitting device packages are connected in series in a complete product and driven by one integrated circuit, one frame interval is divided into N sub-intervals and each light emitting diode chip is driven during one sub-interval. In this case, a flicker may occur in a low grayscale due to flickering even before a sufficient voltage is applied to the light emitting diode chip, or due to flickering in some areas when a speed of a camera shutter is increased. In addition, a ghost or afterimage phenomenon in which a previous pixel value is dimmed again may occur due to a parasitic capacitances in each package.

In the active matrix scheme according to the example embodiment illustrated in FIG. 4A, each light emitting device package may include a pixel driving integrated circuit, and thus each of the light emitting device packages may be driven using the entire one frame interval even if the N light emitting device packages are connected in series. The emission time of one light emitting device package may be increased as compared with the passive matrix scheme. Thus, the above-described flicker may not occur. In addition, the light emission operation of the current frame may be performed based on the frame data of the previous frame and there are the reset sections FR1, FR2 and FR3 between adjacent frame intervals. Thus, the above-described ghosting may not occur.

Referring to FIGS. 3 and 4B, the driving current DI1 applied to the light emitting diode chip 310 may have a first current level I1 and a first pulse width W1, and the light emitting diode chip 310 may emit light for a first time corresponding to the first pulse width W1. Similarly, the driving current DI2 applied to the light emitting diode chip 320 may have a second current level I2 and a second pulse width W2, and the light emitting diode chip 320 may emit light for a second time corresponding to the second pulse width W2. The driving current DI3 applied to the light emitting diode chip 330 may have a third current level I3 and a third pulse width W3, and the light emitting diode chip 330 may emit light for a third time corresponding to the third pulse width W3.

In an example embodiment, as the width of the driving current increases, the light emitting diode chip may emit light with high grayscale (or luminance). When the driving currents DI1, DI2, and DI3 of the waveforms illustrated in FIG. 4B are applied to the light emitting diode chips 310, 320, and 330, respectively, the light emitting diode chip 310 may emit light to have a grayscale higher than that of the light emitting diode chip 320 and lower than that of the light emitting diode chip 330. For example, when the driving current has the maximum pulse width corresponding to the entire emission section FE1 such as the driving current DI3, the light emitting diode chip 330 may emit light with the maximum grayscale.

In an example embodiment, the first current level I1, the second current level I2, and the third current level I3 may be substantially the same as or different from each other. In addition, the first pulse width W1, the second pulse width W2, and the third pulse width W3 may be changed according to the grayscale to be displayed (for example, a desired grayscale).

The light emitting diode chips 310, 320, and 330 may have different luminance characteristics according to the forward voltage Vf and the current, and may have different wavelength shifts due to manufacturing distribution and difference in wavelength of emitted light. Therefore, it may be difficult to apply a pulse amplitude modulation scheme (in which the current level is controlled to adjust the grayscale). By using the pulse width modulation scheme, in which the emission time is controlled to adjust the grayscale while fixing the current level, the luminous efficiency may be improved or enhanced while avoiding problems such as wavelength shift due to input current, distribution and low efficiency at low current, or the like.

Figure 5:
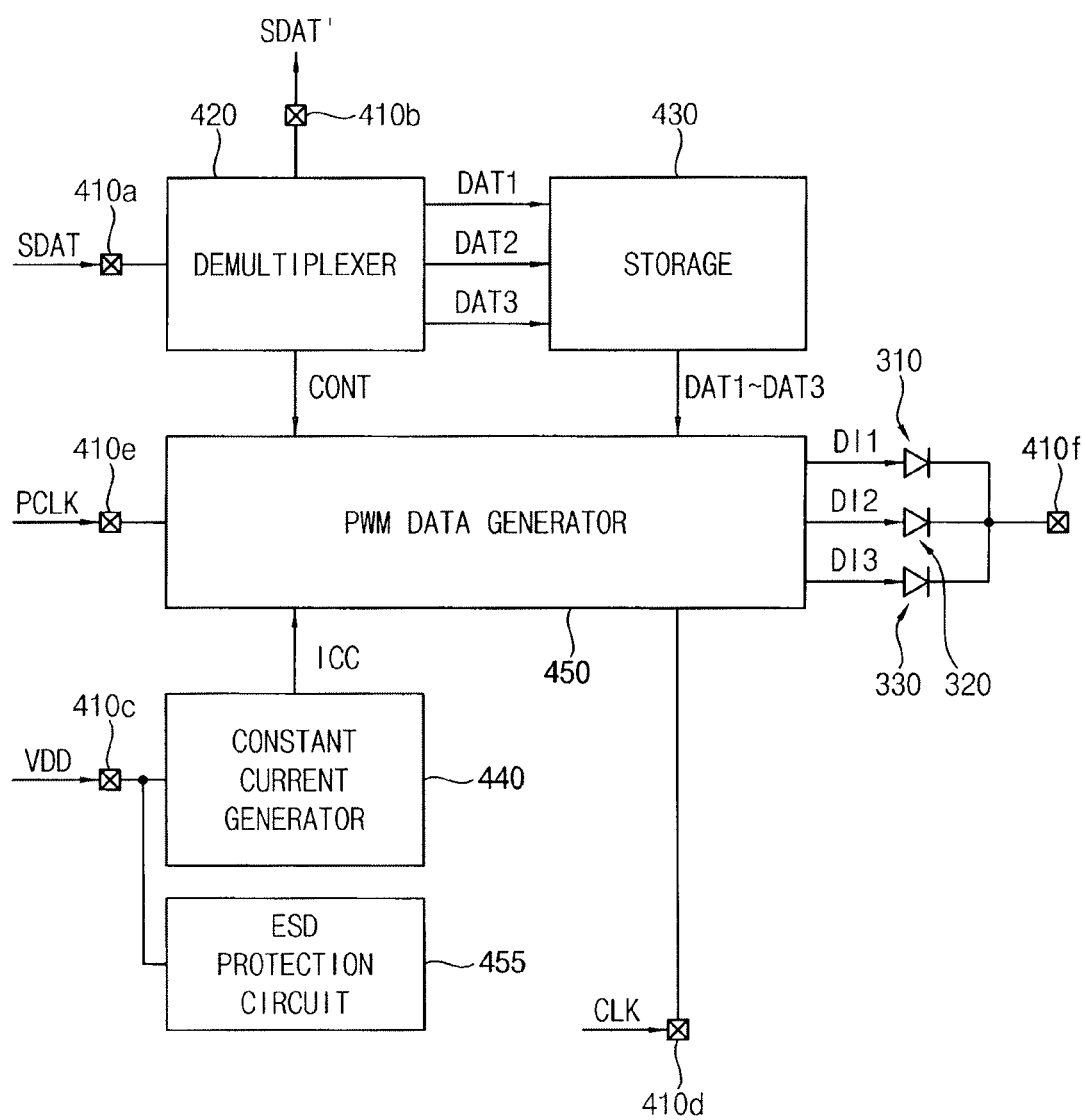
FIGS. 5 and 6 illustrate block diagrams of other examples of a pixel driving integrated circuit included in a light emitting device package according to an example embodiment.
Figure 6:
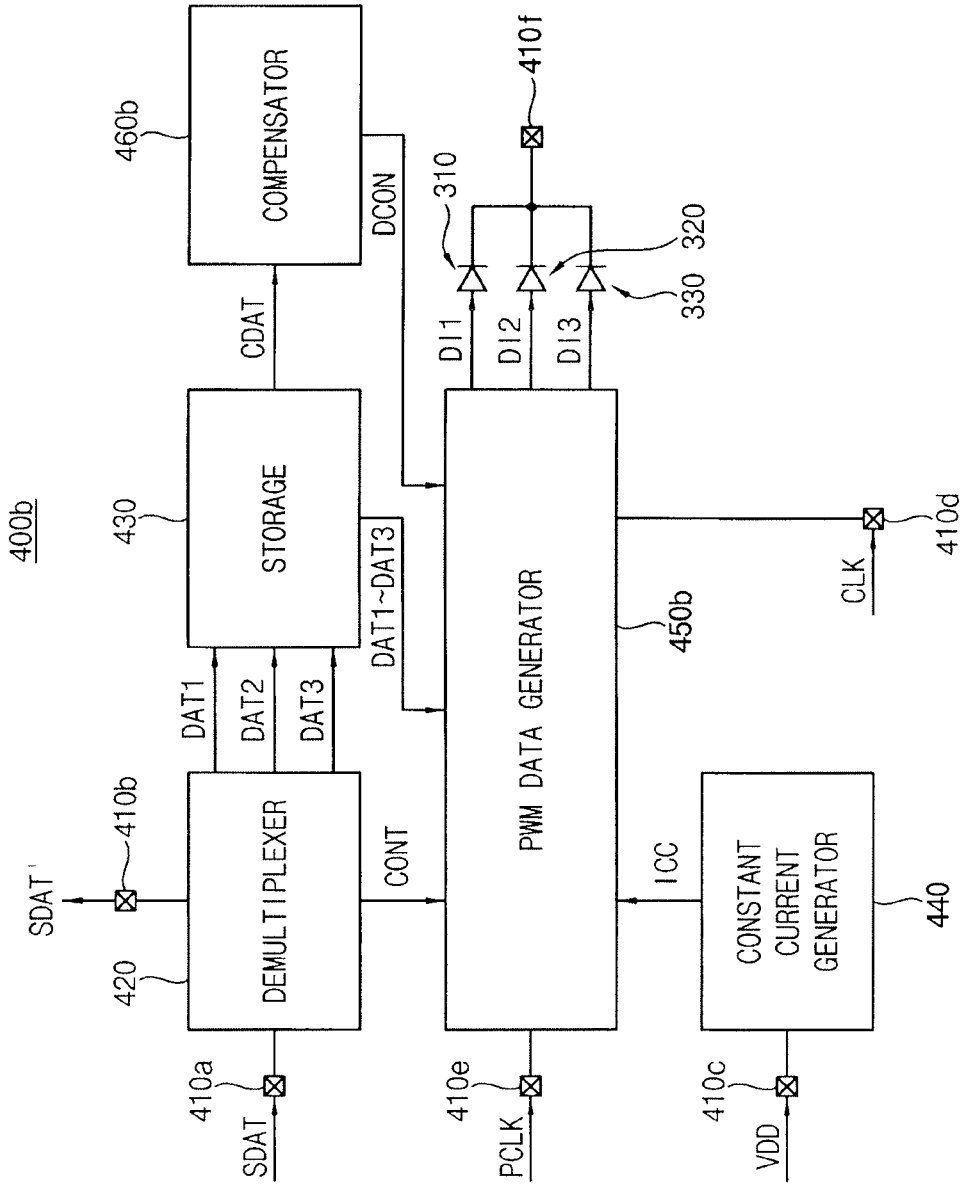

FIGS. 5 and 6 are block diagrams illustrating other examples of a pixel driving integrated circuit included in a light emitting device package according to an example embodiment. Descriptions of elements set forth above with respect to FIG. 3 may not be repeated.

Referring to FIG. 5, a pixel driving integrated circuit 400a may be implemented to further include an electrostatic discharge (ESD) protection circuit 455 in the pixel driving integrated circuit 400 of FIG. 3. The pixel driving integrated circuit 400a of FIG. 5 may be substantially the same as the pixel driving integrated circuit 400 of FIG. 3, except that the pixel driving integrated circuit 400a further includes the electrostatic discharge protection circuit 455.

The electrostatic discharge protection circuit 455 may be connected to the power pad 410c. When an electrostatic discharge event occurs such that a large amount of electric charge flows in the electrostatic discharge protection circuit 455 via the power pad 410c, the electrostatic discharge protection circuit 455 may be turned on to discharge the electric charges. Thus, the electrostatic discharge protection circuit 455 may protect elements included in the pixel driving integrated circuit 400a from the ESD event. Although not illustrated in FIG. 5, the electrostatic discharge protection circuit 455 may also be connected to the ground pad 410f.

In addition, although not illustrated in FIG. 5, the pixel driving integrated circuit 400a may further include an additional electrostatic discharge protection circuit connected to at least one of the data input pad 410a, the data output pad 410b, the first clock pad 410d, and the second clock pad 410e.

Referring to FIG. 6, a pixel driving integrated circuit 400b may be implemented to further include a compensator 460b in the pixel driving integrated circuit 400 of FIG. 3. The pixel driving integrated circuit 400b of FIG. 6 may be substantially the same as the pixel driving integrated circuit 400 of FIG. 3, except that the pixel driving integrated circuit 400b further includes the compensator 460b and a configuration of a pulse width modulation data generator 450b is somewhat different.

In the example embodiment illustrated in FIG. 6, the storage 430 may further store characteristic data CDAT associated with the light emitting diode chips 310, 320, and 330. The compensator 460b may generate a duty ratio control signal DCON for controlling the driving currents DI1, DI2, and DI3 based on the characteristic data CDAT. For example, the compensator 460b may include a memory function. The pulse width modulation data generator 450b may adjust duty ratios of the driving currents DI1, DI2, and DI3 based on the duty ratio control signal DCON such that the adjusted driving currents DI1, DI2, and DI3 are appropriate or suitable for the light emitting diode chips 310, 320, and 330. In an example embodiment, the compensator 460b may be included in the storage 430 or the pulse width modulation data generator 450b.

Figure 7:
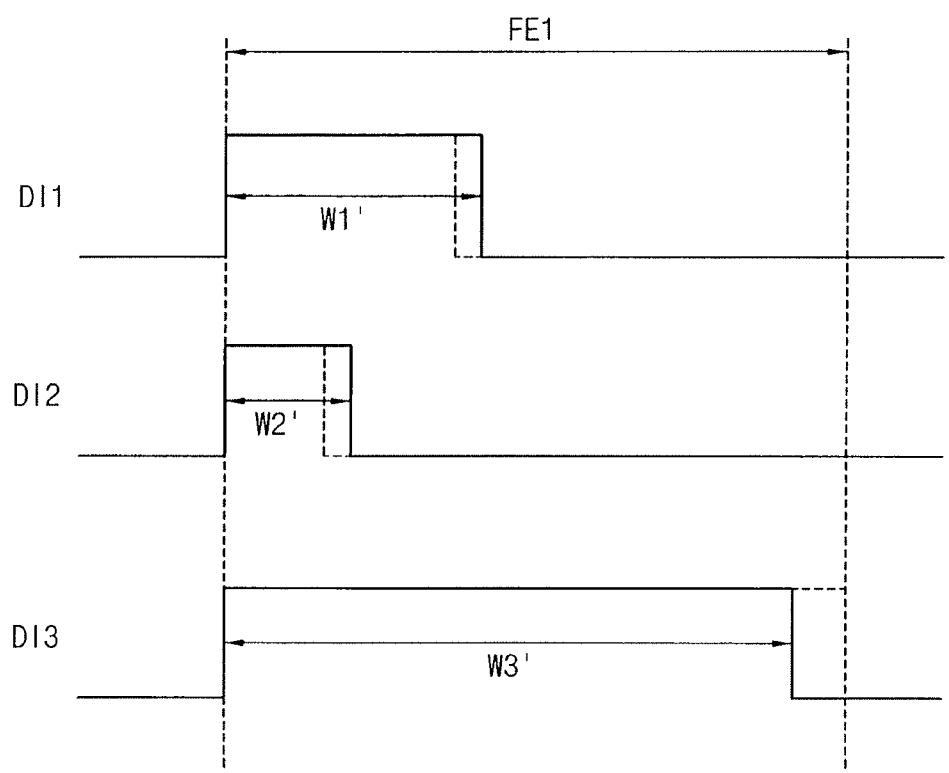
FIG. 7 illustrates a diagram for describing an operation of the pixel driving integrated circuit of FIG. 6.

FIG. 7 is a diagram for describing an operation of the pixel driving integrated circuit of FIG. 6.

Referring to FIGS. 6 and 7, the pulse width modulation data generator 450b may adjust pulse widths W1', W2', and WY of the driving currents DI1, DI2, and DI3 based on the duty ratio control signal DCON. As described above, intrinsic characteristics of the light emitting diode chips 310, 320, and 330 may be different from each other due to a manufacturing distribution, and the emission time for representing the same grayscale may be different from chip to chip and/or from package to package. Thus, the intrinsic characteristics of the light emitting diode chips 310, 320, and 330 may be stored in each package in advance, and may be reflected in actual driving. Compared with the example embodiment illustrated in FIG. 4, the pulse widths W1' and W2' are increased and the pulse width W3' is decreased in the example embodiment illustrated in FIG. 7. However, FIG. 7 is merely an example.

Figure 8:
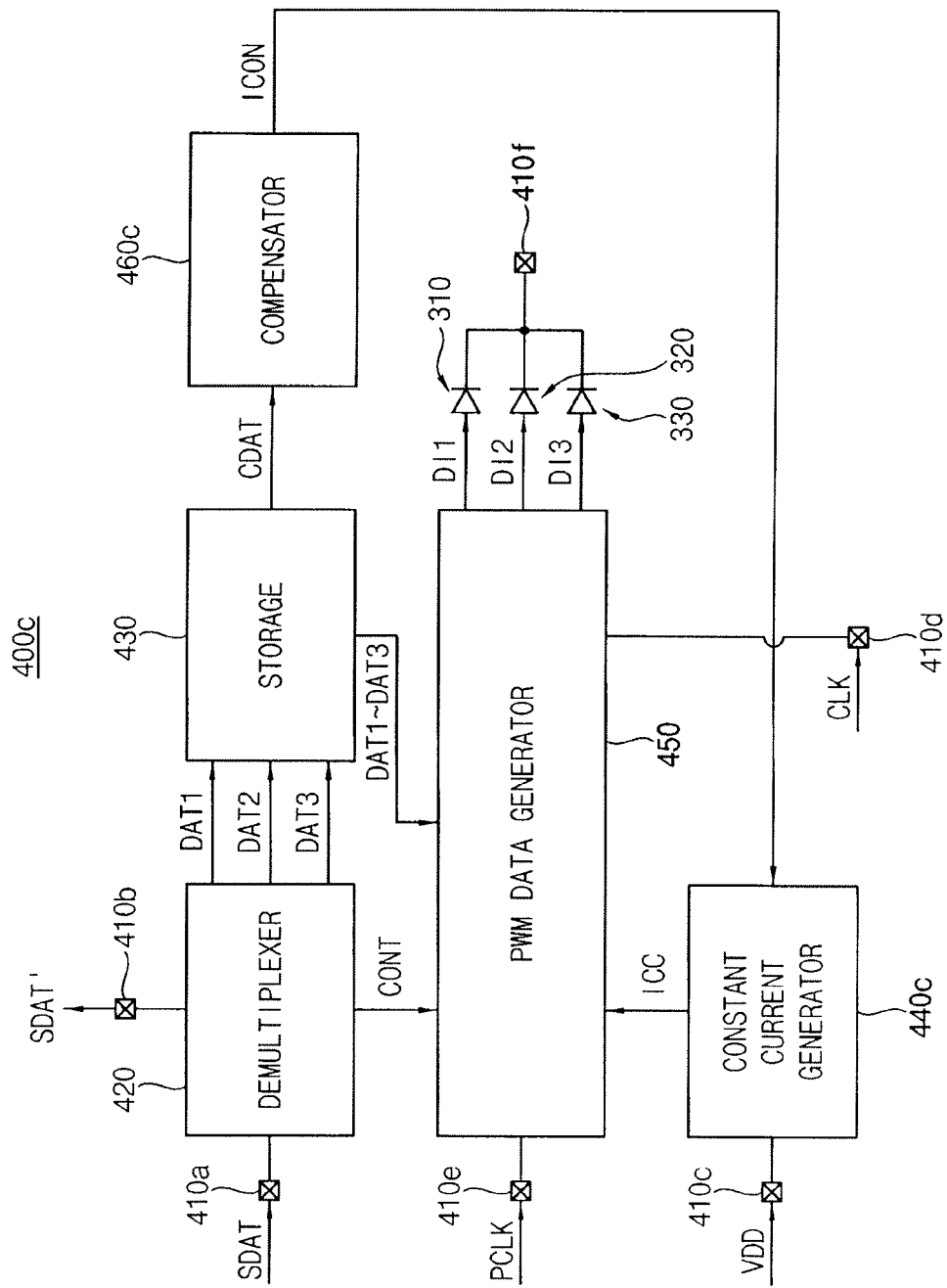
FIG. 8 illustrates a block diagram of another example of a pixel driving integrated circuit included in a light emitting device package according to an example embodiment.

FIG. 8 is a block diagram illustrating another example of a pixel driving integrated circuit included in a light emitting device package according to an example embodiment. Descriptions of elements set forth above with respect to FIGS. 3 and 6 may not be repeated.

Referring to FIG. 8, a pixel driving integrated circuit 400c may be implemented to further include a compensator 460c in the pixel driving integrated circuit 400 of FIG. 3. The pixel driving integrated circuit 400c of FIG. 8 may be substantially the same as the pixel driving integrated circuit 400 of FIG. 3, except that the pixel driving integrated circuit 400c further includes the compensator 460c and a configuration of a constant current generator 440c is somewhat different.

The compensator 460c may generate a current control signal ICON for controlling the driving currents DI1, DI2, and DI3 based on the characteristic data CDAT provided from the storage 430. For example, the compensator 460c may include a gamma 2.2 circuit. The constant current generator 440c may adjust a current level (or magnitude) of the reference current ICC based on the current control signal ICON, and the pulse width modulation data generator 450 may adjust current levels (or magnitudes) of the driving currents DI1, DI2, and DI3 based on the adjusted reference current ICC such that the adjusted driving currents DI1, DI2, and DI3 are appropriate or suitable for the light emitting diode chips 310, 320, and 330. In an example embodiment, the compensator 460c may be included in the constant current generator 440c.

Figure 9:
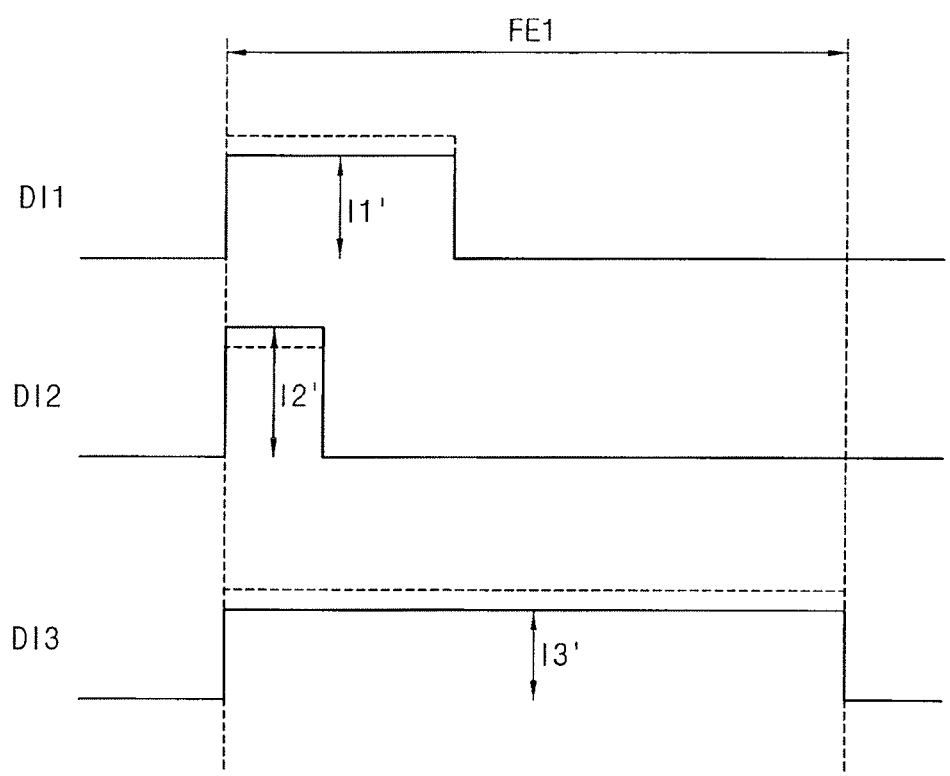
FIG. 9 illustrates a diagram for describing an operation of the pixel driving integrated circuit of FIG. 8.

FIG. 9 is a diagram for describing an operation of the pixel driving integrated circuit of FIG. 8. Descriptions of elements set forth above with respect to FIG. 7 may not be repeated.

Referring to FIGS. 8 and 9, the pulse width modulation data generator 450 may adjust current levels I1', I2', and I3' of the driving currents DI1, DI2, and DI3 based on the adjusted reference current ICC. Compared with the example embodiment illustrated in FIG. 4, the current level I2' is increased and the current levels I1' and I3' are decreased in the example embodiment illustrated in FIG. 9. However, FIG. 9 is merely an example.

In an example embodiment, the characteristic data CDAT may be provided from an external controller (for example, the controller 2400 in FIG. 27), and/or the driving data DAT1, DAT2, and DAT3 modified by reflecting the characteristic data CDAT may be provided from the external controller. In this example embodiment, the driving currents DI1, DI2, and DI3 may be adjusted to be appropriate or suitable for the characteristics of the light emitting diode chips 310, 320, and 330 as described with reference to FIGS. 7 and 9, without the compensator 460b in FIG. 6 and/or the compensator 460c in FIG. 8.

FIGS. 10, 11, 12, 13, 14, 15, and 16 are block diagrams illustrating still other examples of a pixel driving integrated circuit included in a light emitting device package according to an example embodiment. Descriptions of elements set forth above with respect to FIG. 3 may not be repeated.

Figure 10:
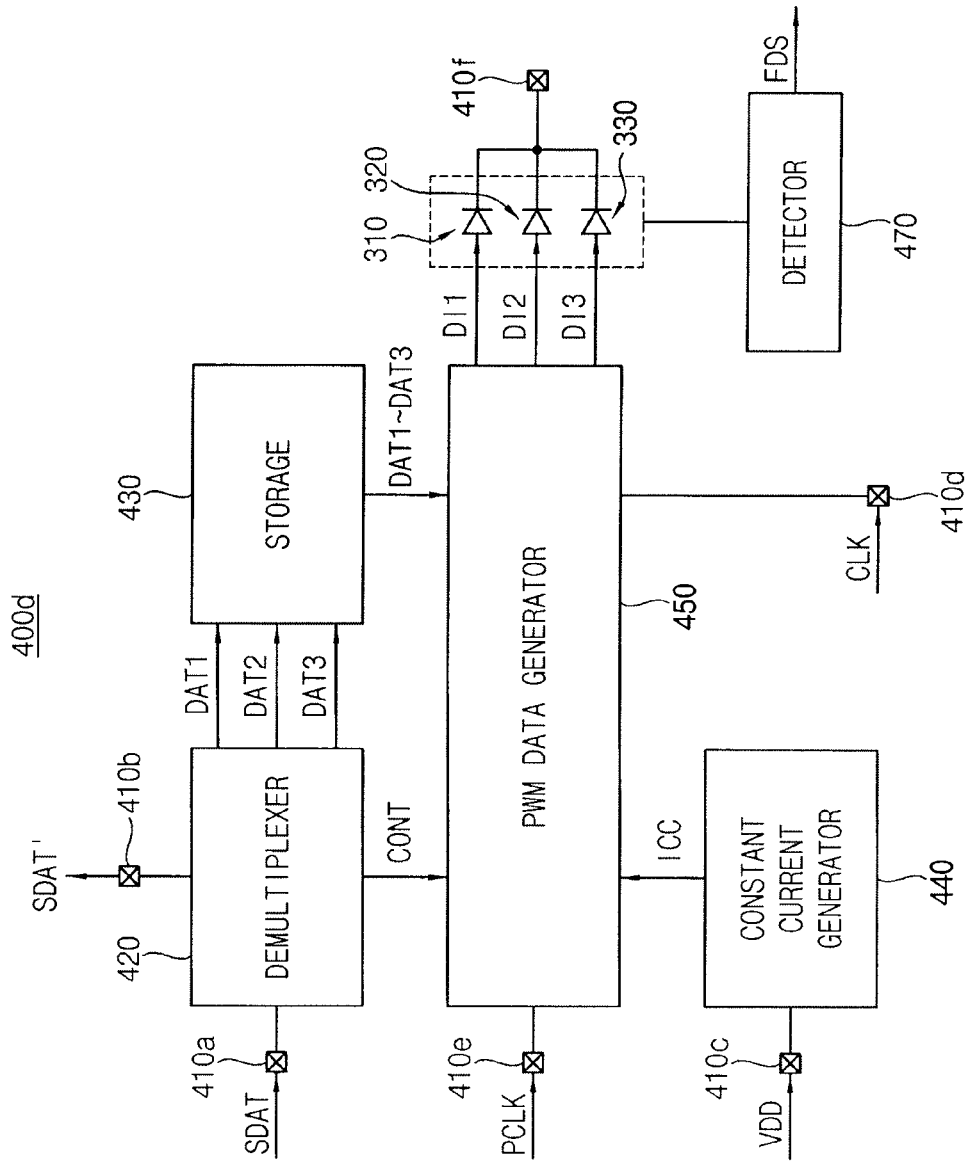
FIGS. 10, 11, 12, 13, 14, 15 and 16 illustrate block diagrams of additional examples of a pixel driving integrated circuit included in a light emitting device package according to an example embodiment.

Referring to FIG. 10, a pixel driving integrated circuit 400d may be implemented to further include a detector 470 in the pixel driving integrated circuit 400 of FIG. 3. The pixel driving integrated circuit 400d of FIG. 10 may be substantially the same as the pixel driving integrated circuit 400 of FIG. 3, except that the pixel driving integrated circuit 400d further includes the detector 470.

The detector 470 may detect an electrical abnormality and may generate a failure detection signal FDS when the electrical abnormality occurs on at least one of the light emitting diode chips 310, 320, and 330. For example, the electrical abnormality may include a short failure, an open failure, and the like. In the example embodiment illustrated in FIG. 10, the failure detection signal FDS may be fed back to an external controller (for example, the controller 2400 in FIG. 27), and the external controller may restrict or limit a driving of the light emitting diode chips 310, 320, and 330 based on the failure detection signal FDS. Although not illustrated in FIG. 10, the pixel driving integrated circuit 400d may further include a pad for providing the failure detection signal FDS to the external controller.

Figure 11:
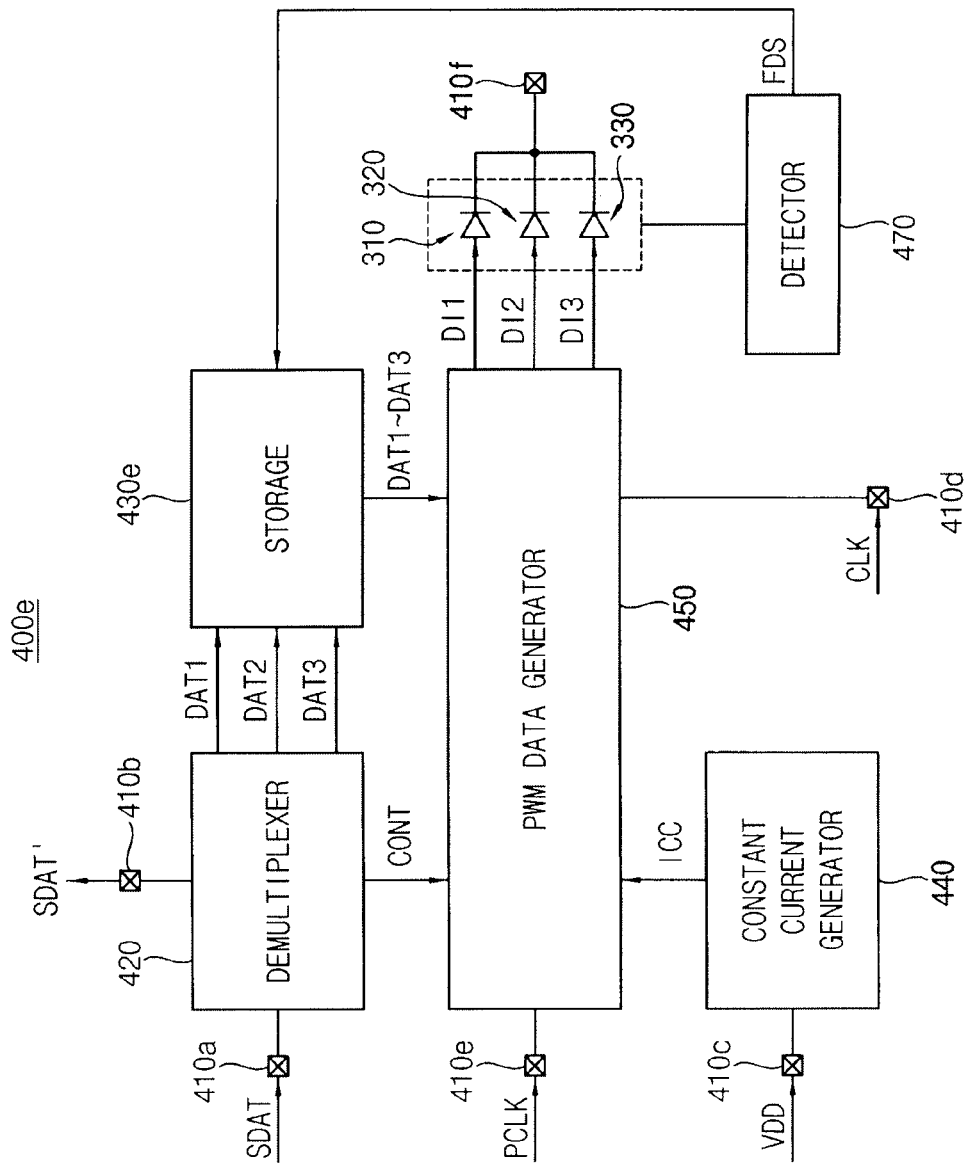

Referring to FIG. 11, a pixel driving integrated circuit 400e may be implemented to further include the detector 470 in the pixel driving integrated circuit 400 of FIG. 3. The pixel driving integrated circuit 400e of FIG. 11 may be substantially the same as the pixel driving integrated circuit 400 of FIG. 3, except that the pixel driving integrated circuit 400e further includes the detector 470 and a configuration of a storage 430e is somewhat different. The detector 470 in FIG. 11 may be substantially the same as the detector 470 in FIG. 10.

In the example embodiment illustrated in FIG. 11, the failure detection signal FDS may be fed back to the storage 430e, and the storage 430e may restrict or limit (for example, mask) the driving of the light emitting diode chips 310, 320, and 330 based on the failure detection signal FDS.

Figure 12:
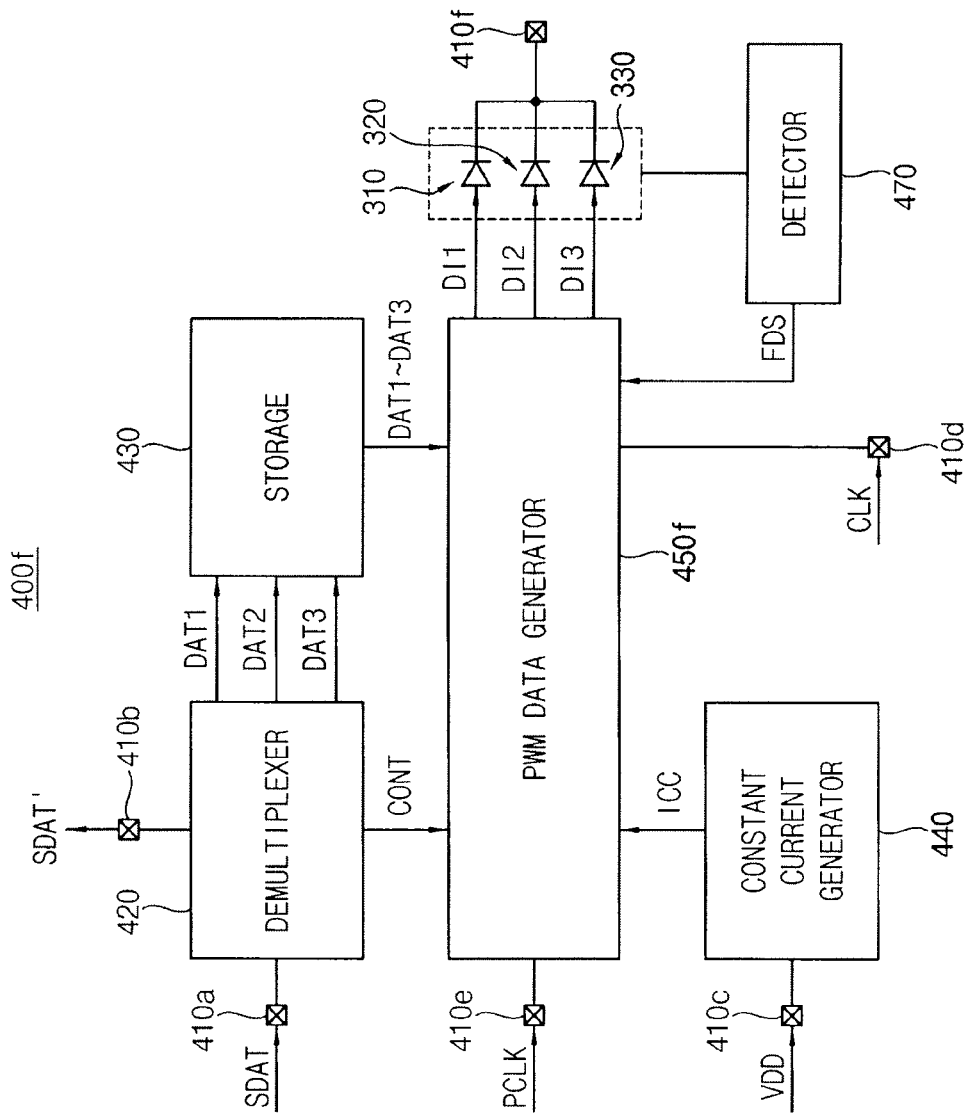

Referring to FIG. 12, a pixel driving integrated circuit 400f may be implemented to further include the detector 470 in the pixel driving integrated circuit 400 of FIG. 3. The pixel driving integrated circuit 400f of FIG. 12 may be substantially the same as the pixel driving integrated circuit 400 of FIG. 3, except that the pixel driving integrated circuit 400f further includes the detector 470 and a configuration of a pulse width modulation data generator 450f is somewhat different. The detector 470 in FIG. 12 may be substantially the same as the detector 470 in FIG. 10.

In the example embodiment illustrated in FIG. 12, the failure detection signal FDS may be fed back to the pulse width modulation data generator 450f, and the pulse width modulation data generator 450f may restrict or limit the driving of the light emitting diode chips 310, 320, and 330 based on the failure detection signal FDS.

Figure 13:
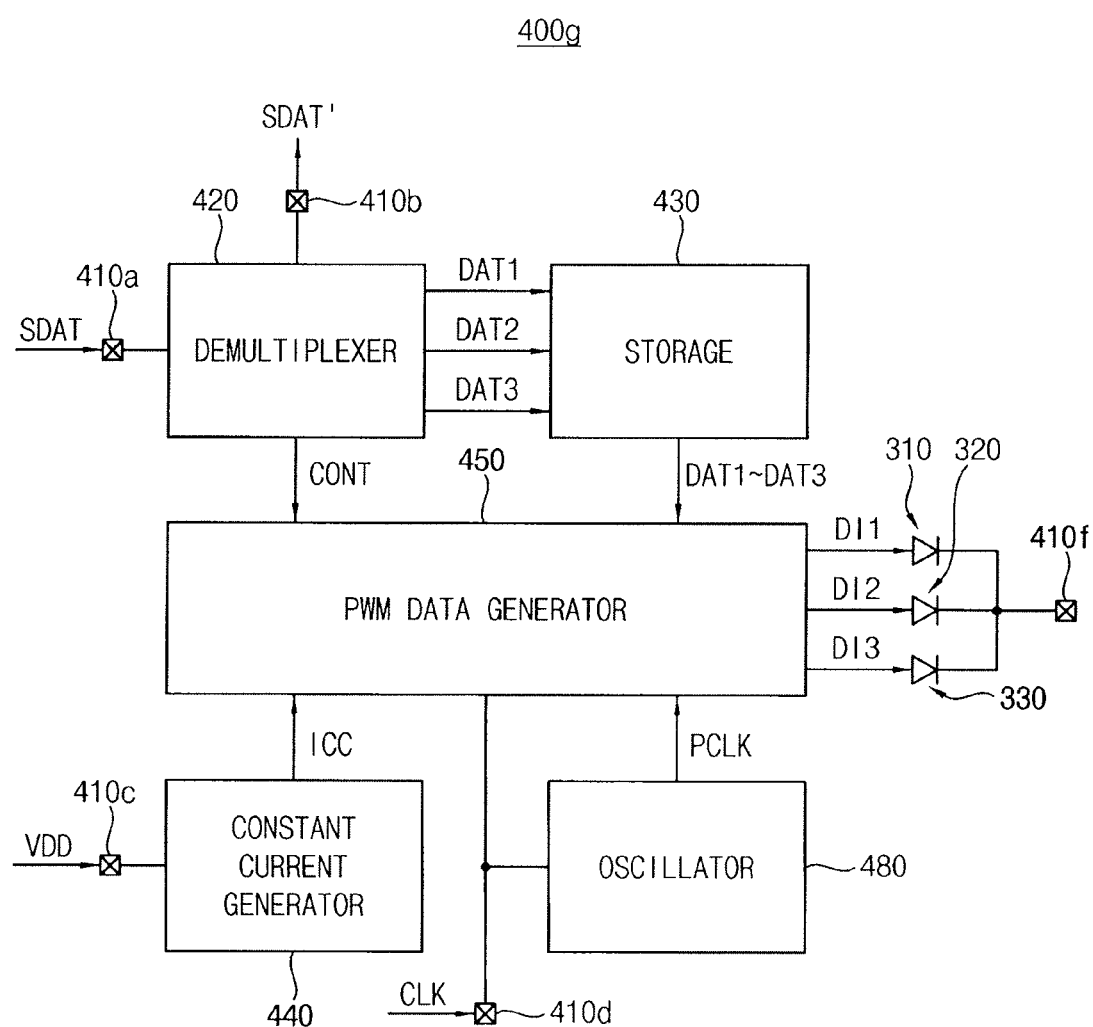
Figure 14:
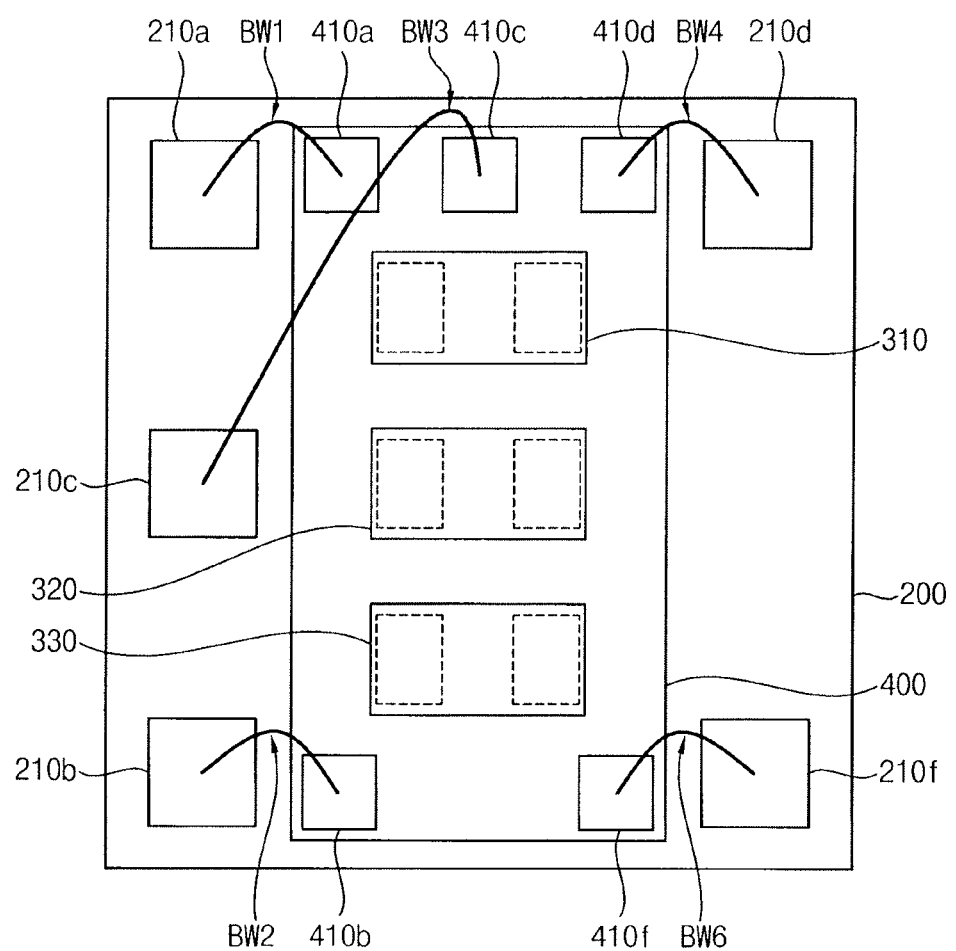

Referring to FIGS. 13 and 14, a pixel driving integrated circuit 400g may be implemented to further include an oscillator 480 in the pixel driving integrated circuit 400 of FIG. 3. The pixel driving integrated circuit 400g of FIG. 13 may be substantially the same as the pixel driving integrated circuit 400 of FIG. 3, except that the pixel driving integrated circuit 400g further includes the oscillator 480 and the second clock pad 410e is omitted.

The oscillator 480 may generate the pulse width modulation clock signal PCLK based on the clock signal CLK received via the first clock pad 410d. The oscillator 480 may include, for example, a ring oscillator, a RC oscillator, a crystal oscillator, or a temperature compensated crystal oscillator (TCXO).

As illustrated in FIG. 14, as the second clock pad 410e of the pixel driving integrated circuit 400g is omitted, the second clock pad 210e of the package substrate 200 may also be omitted.

Figure 15:
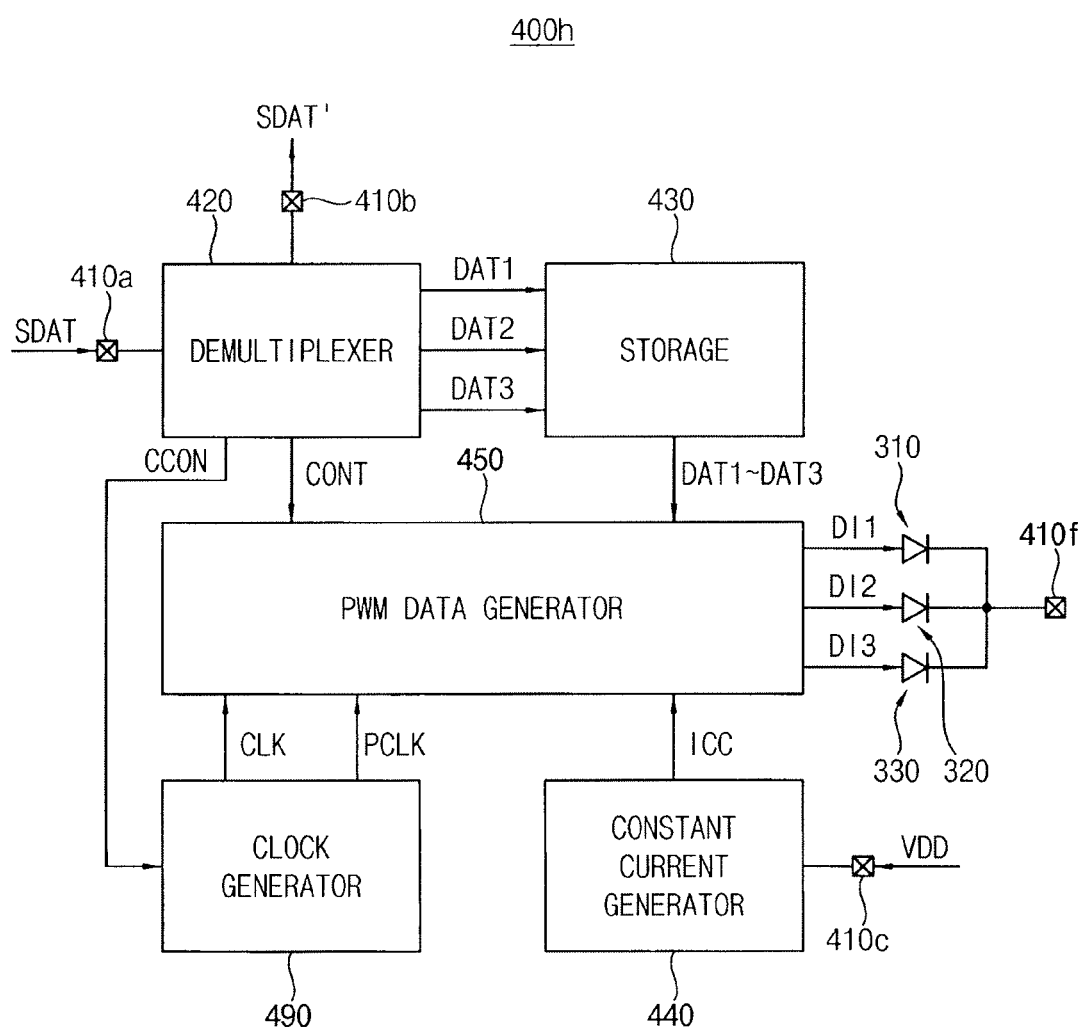
Figure 16:
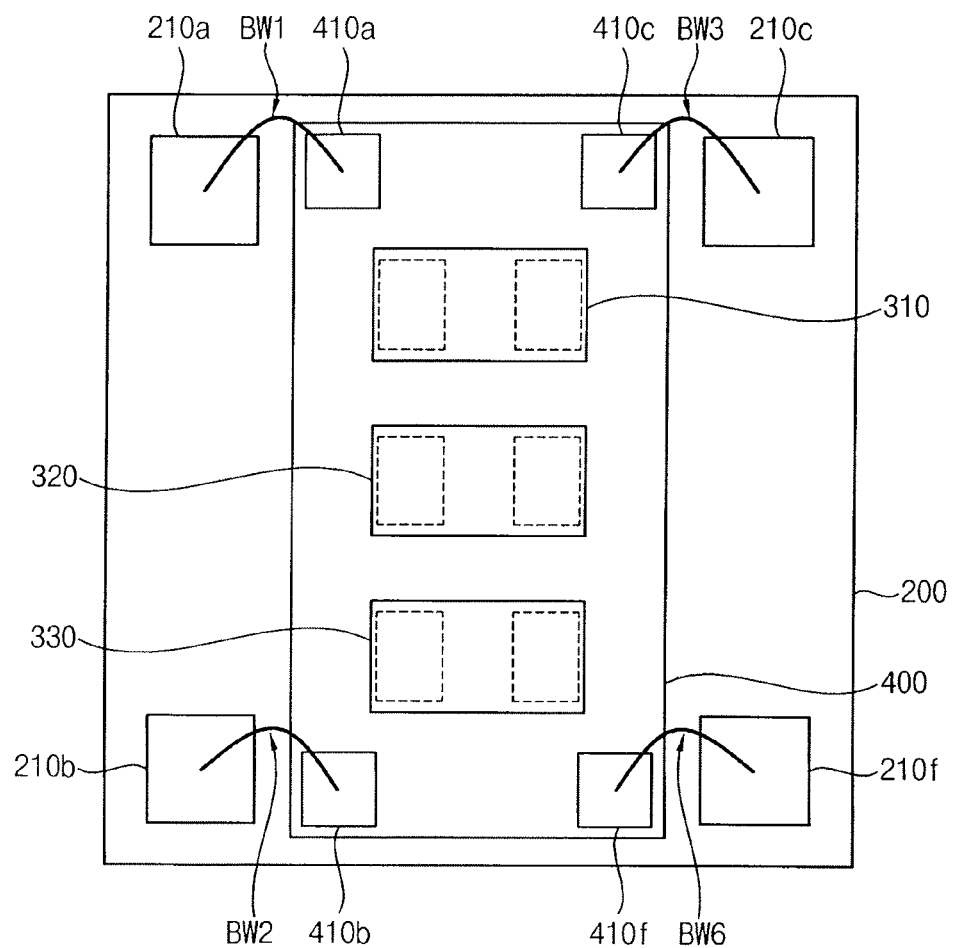

Referring to FIGS. 15 and 16, a pixel driving integrated circuit 400h may be implemented to further include a clock generator 490 in the pixel driving integrated circuit 400 of FIG. 3. The pixel driving integrated circuit 400h of FIG. 15 may be substantially the same as the pixel driving integrated circuit 400 of FIG. 3, except that the pixel driving integrated circuit 400h further includes the clock generator 490 and the first clock pad 410d and the second clock pad 410e are omitted.

The first frame data distributed by the demultiplexer 420 may further include clock data CCON. The clock generator 490 may generate the clock signal CLK and the pulse width modulation clock signal PCLK based on the clock data CCON.

As illustrated in FIG. 16, as the first clock pad 410d and the second clock pad 410e of the pixel driving integrated circuit 400h are omitted, the first clock pad 210d and the second clock pad 210e of the package substrate 200 may also be omitted.

In an example embodiment, two or more of the examples described with reference to FIGS. 5, 6, 8, 10, 11, 12, 13 and 15 may be combined to implement the pixel driving integrated circuit included in the light emitting device package according to an example embodiment.

Figure 17:
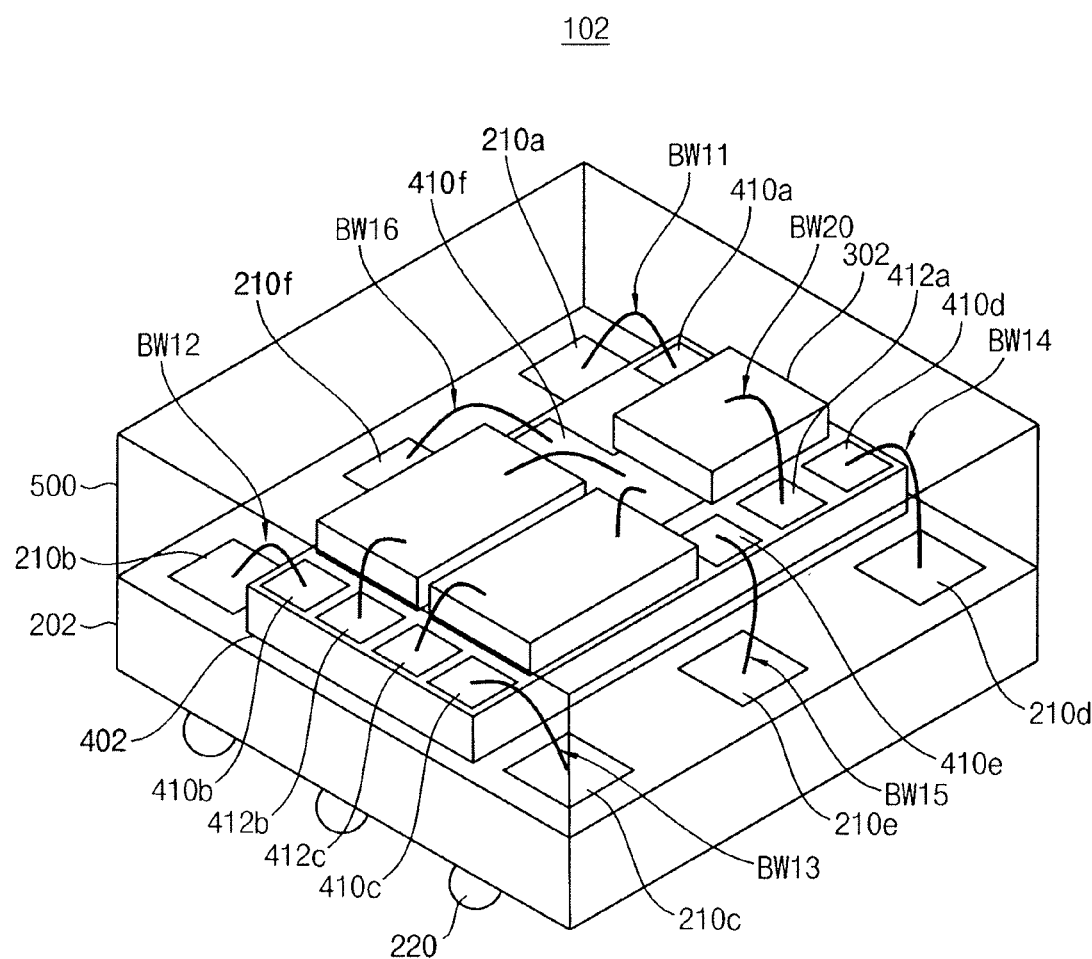
FIG. 17 illustrates a perspective view of a light emitting device package according to an example embodiment.
Figure 18A:
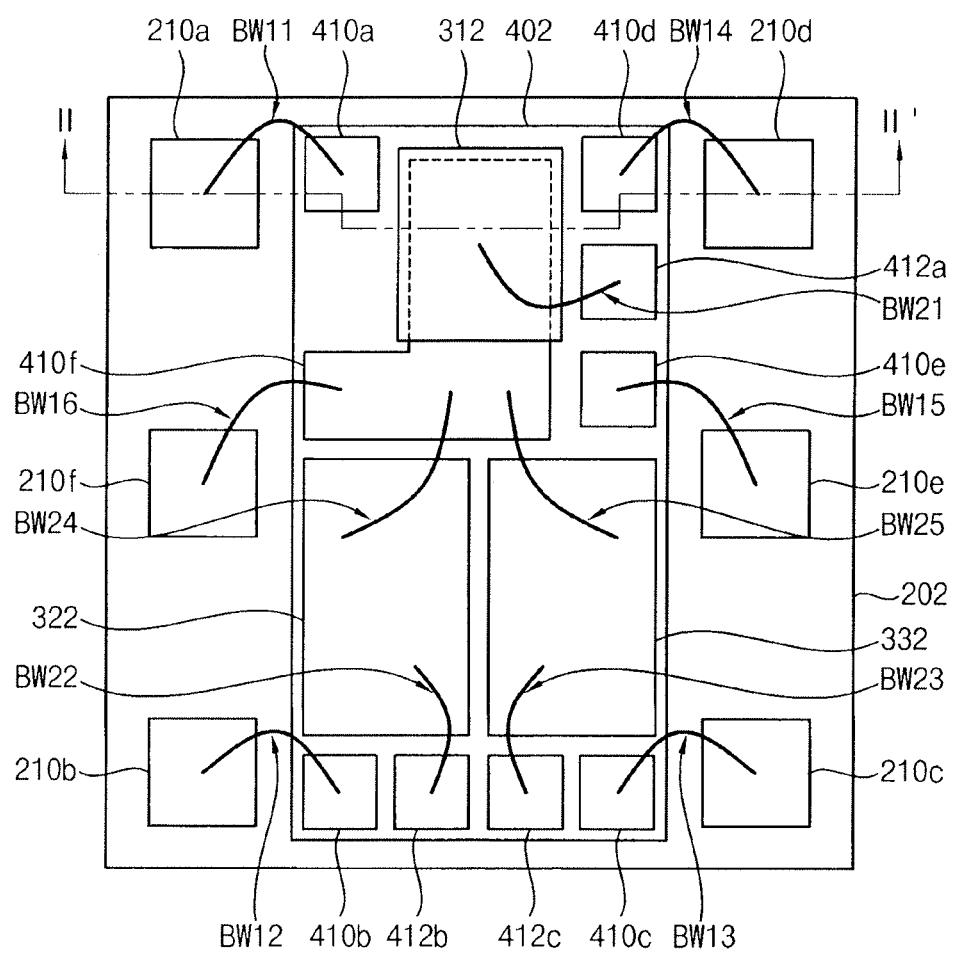
FIGS. 18A and 18B illustrate a plan view and a cross-sectional view of a light emitting device package of FIG. 17.
Figure 18B:
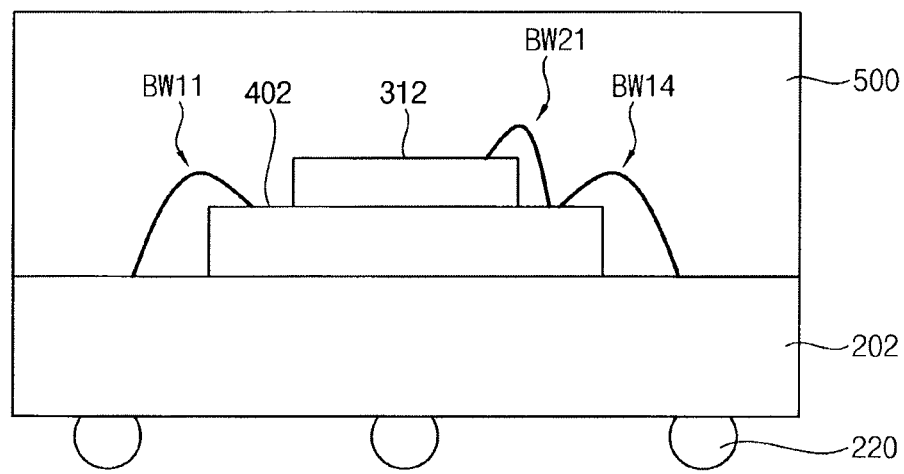

FIG. 17 is a perspective view of a light emitting device package according to an example embodiment. FIGS. 18A and 18B are a plan view and a cross-sectional view of a light emitting device package of FIG. 17. FIG. 18B illustrates an example of the light emitting device package taken along a line II-II' of FIG. 18A. Descriptions of elements set forth above with respect to FIGS. 1, 2A, and 2B may not be repeated.

Referring to FIGS. 17, 18A, and 18B, a light emitting device package 102 includes a light emitting diode pixel and a pixel driving integrated circuit 402. The light emitting device package 102 may further include a package substrate 202, a sealing member 500 and a plurality of bonding wires BW11, BW12, BW13, BW14, BW15, BW16 and BW20.

The light emitting diode pixel may include light emitting diode chips 302 each of which emits light. For example, the light emitting diode chips 302 may include a first light emitting diode chip 312, a second light emitting diode chip 322, and a third light emitting diode chip 332.

The pixel driving integrated circuit 402 may be disposed under the light emitting diode chips 302 of the light emitting diode pixel. The pixel driving integrated circuit 402 may drive the light emitting diode chips 302 based on the active matrix scheme and the pulse width modulation scheme. The pixel driving integrated circuit 402 may be implemented as described with reference to FIGS. 3 through 16.

The pixel driving integrated circuit 402 may include a plurality of pads 410a-410f, and may further include pads 412a, 412b and 412c for electrical connection with the light emitting diode chips 302. The bonding wire BW20 may include a plurality of bonding wires BW21, BW22, BW23, BW24 and BW25, and may be referred to as IC bonding wires.

In the example embodiment illustrated in FIG. 17, the light emitting diode chips 302 may be implemented in the form of epi-up chips or non-flip chips. For example, the light emitting diode chips 302 and the pixel driving integrated circuit 402 may be directly connected through at least one bonding wire. The bonding wire BW21 may connect the first light emitting diode chip 312 with the pad 412a, the bonding wire BW22 may connect the second light emitting diode chip 322 with the pad 412b, the bonding wire BW23 may connect the third light emitting diode chip 332 with the pad 412c, and the bonding wires BW24 and BW25 may connect the second and third light emitting diode chips 322 and 332 with the ground pad 410f. Although not illustrated in detail, the first light emitting diode chip 312 and the ground pad 410f may be directly connected through an electrode.

The package substrate 202, the plurality of pads 210a-210f, the plurality of conductive bumps 220, the plurality of bonding wires BW11-BW16, and the sealing member 500 in FIG. 17 may be substantially the same as the package substrate 200, the plurality of pads 210a-210f, the plurality of conductive bumps 220, the plurality of bonding wires BW1-BW6, and the sealing member 500 in FIG. 1, respectively.

Figure 19:
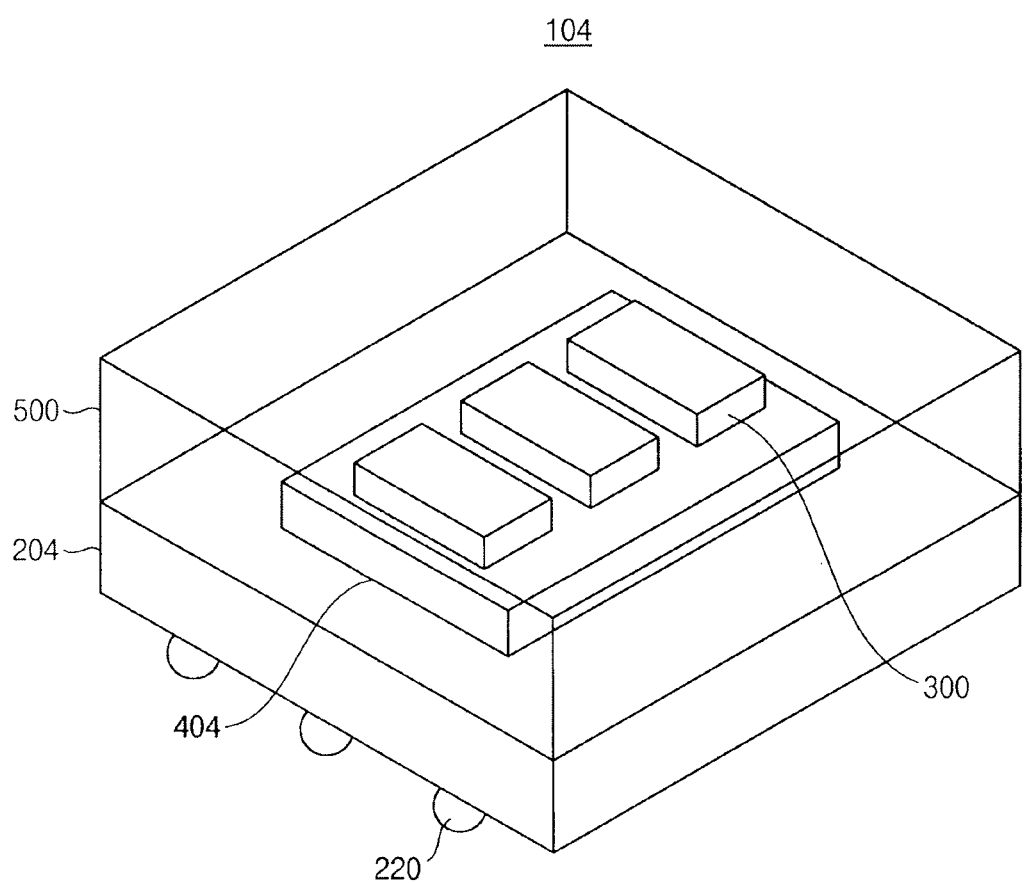
FIG. 19 illustrates a perspective view of a light emitting device package according to an example embodiment.
Figure 20A:
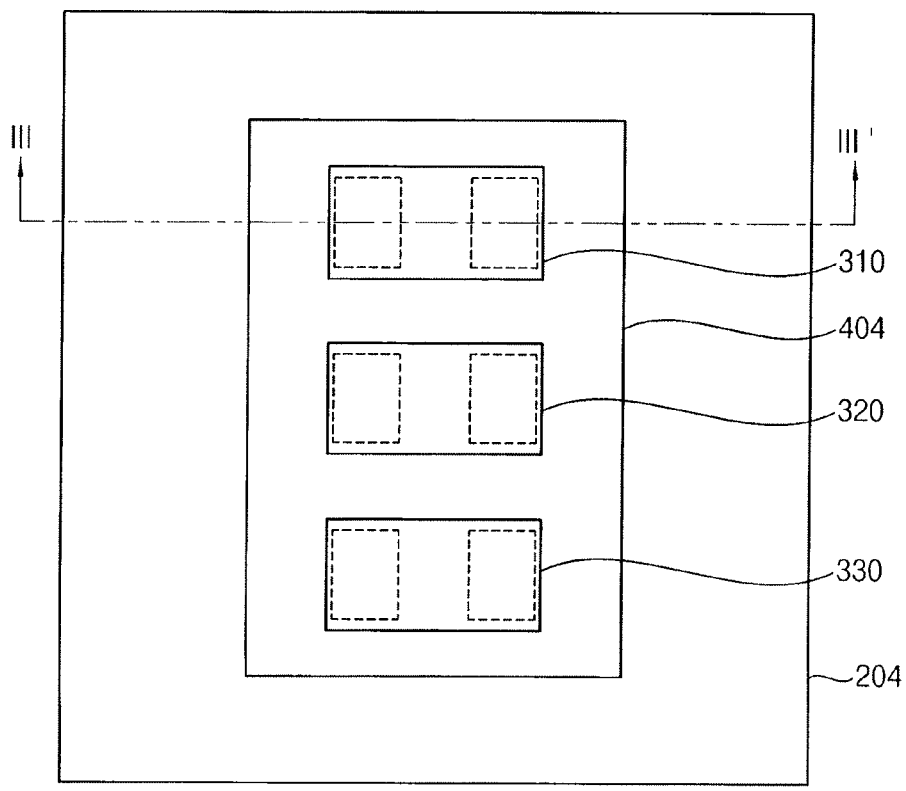
FIGS. 20A and 20B illustrate a plan view and a cross-sectional view of a light emitting device package of FIG. 19.
Figure 20B:
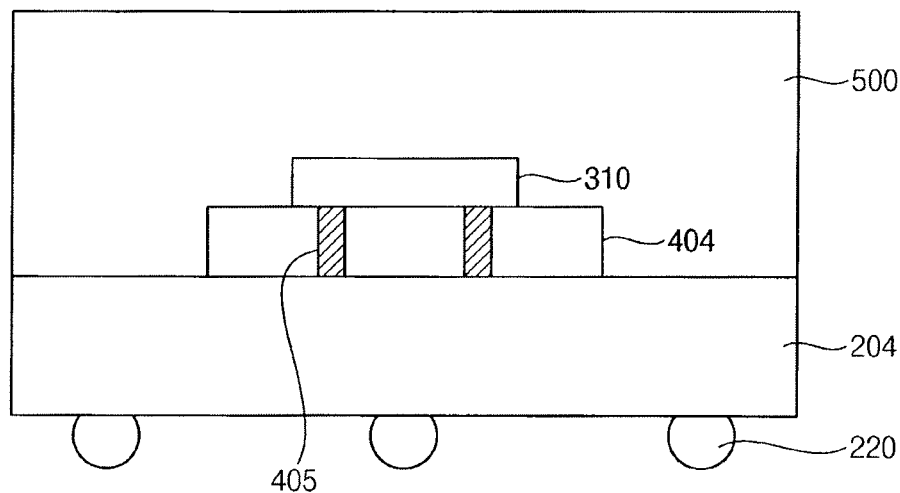

FIG. 19 is a perspective view of a light emitting device package according to an example embodiment. FIGS. 20A and 20B are a plan view and a cross-sectional view of a light emitting device package of FIG. 19. FIG. 20B illustrates an example of the light emitting device package taken along a line III-III' of FIG. 20A. Descriptions of elements set forth above with respect to FIGS. 1, 2A and 2B may not be repeated.

Referring to FIGS. 19, 20A and 20B, a light emitting device package 104 may include a light emitting diode pixel and a pixel driving integrated circuit 404. The light emitting device package 104 may further include a package substrate 204 and a sealing member 500.

The light emitting diode pixel and the light emitting diode chips 300 included therein in FIG. 19 may be substantially the same as the light emitting diode pixel and the light emitting diode chips 300 in FIG. 1, respectively.

The pixel driving integrated circuit 404 may be disposed under the light emitting diode chips 300 of the light emitting diode pixel. The pixel driving integrated circuit 404 may drive the light emitting diode chips 300 based on the active matrix scheme and the pulse width modulation scheme. The pixel driving integrated circuit 404 may be implemented as described with reference to FIGS. 3 through 16.

As with the example embodiment illustrated in FIG. 1, the light emitting diode chips 300 may be implemented in the form of flip chips in the example embodiment illustrated in FIG. 19. In addition, in the example embodiment illustrated in FIG. 19, the pixel driving integrated circuit 404 may include at least one through silicon via (TSV) 405, as shown in FIG. 20B. The pixel driving integrated circuit 404 and the package substrate 204 may be connected through at least one through silicon via 405.

When a TSV type IC is used or applied as illustrated in FIG. 20B, the bonding wires may be omitted, which may reduce space, for example, pad space for the bonding wires, and reduce defects associated with the bonding wires. In addition, the package may be molded by forming the sealing member 500 by encapsulation. Thus, the manufacturing process may become easier and the risk of loss in the manufacturing process may be reduced.

Figure 21:
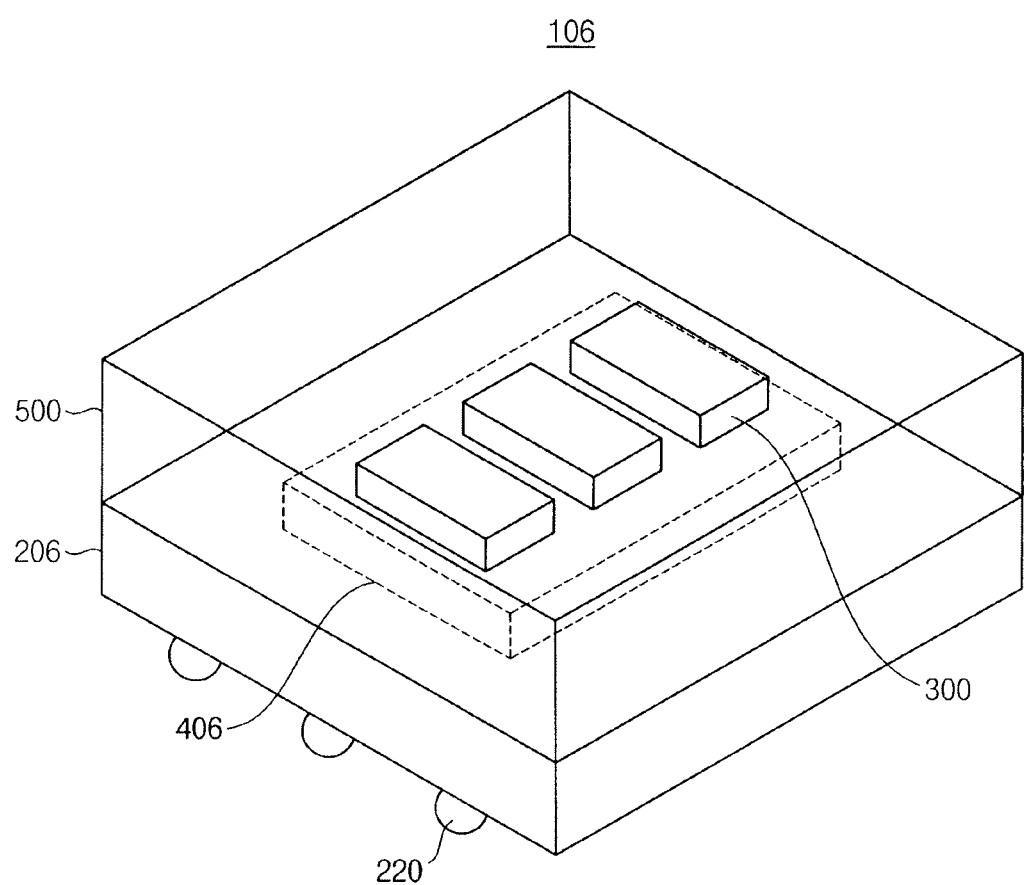
FIG. 21 illustrates a perspective view of a light emitting device package according to an example embodiment.
Figure 22A:
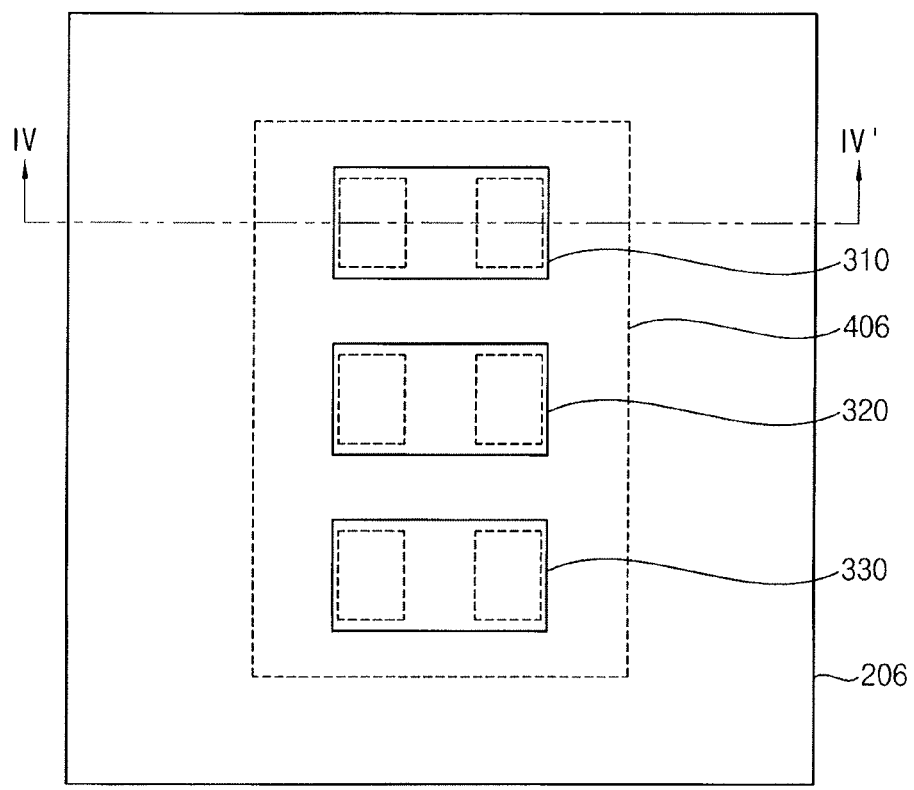
FIGS. 22A and 22B illustrate a plan view and a cross-sectional view of a light emitting device package of FIG. 21.
Figure 22B:
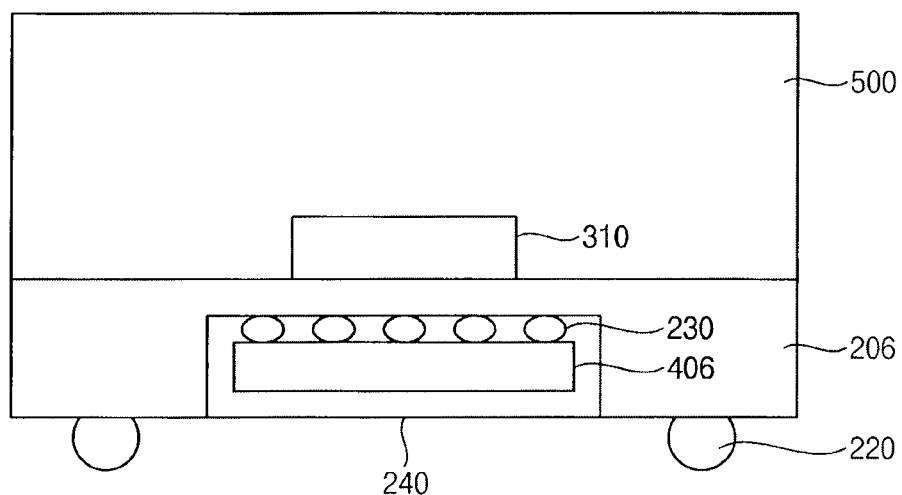

FIG. 21 is a perspective view of a light emitting device package according to an example embodiment. FIGS. 22A and 22B are a plan view and a cross-sectional view of a light emitting device package of FIG. 21. FIG. 22B illustrates an example of the light emitting device package taken along a line IV-IV' of FIG. 22A. Descriptions of elements set forth above with respect to FIGS. 1, 2A and 2B may not be repeated.

Referring to FIGS. 21, 22A and 22B, a light emitting device package 106 may include a light emitting diode pixel and a pixel driving integrated circuit 406. The light emitting device package 106 may further include a package substrate 206 and a sealing member 500.

The light emitting diode pixel and the light emitting diode chips 300 included therein in FIG. 21 may be substantially the same as the light emitting diode pixel and the light emitting diode chips 300 in FIG. 1, respectively.

The pixel driving integrated circuit 406 may be disposed under the light emitting diode chips 300 of the light emitting diode pixel. The pixel driving integrated circuit 406 may drive the light emitting diode chips 300 based on the active matrix scheme and the pulse width modulation scheme. The pixel driving integrated circuit 406 may be implemented as described with reference to FIGS. 3 through 16.

The package substrate 206 may be disposed between the light emitting diode chips 300 and the pixel driving integrated circuit 406. Thus, the light emitting diode chips 300 may be disposed on a first surface (for example, an upper surface) of the package substrate 206, and the pixel driving integrated circuit 406 may be disposed on a second surface (for example, a lower surface) of the package substrate 206 opposite to the first surface of the package substrate 206.

As with the example embodiment illustrated in FIG. 1, the light emitting diode chips 300 may be implemented in the form of flip chips in the example embodiment illustrated in FIG. 21. For example, the light emitting diode chips 300 and the package substrate 206 may be directly connected through at least one electrode. In addition, in the example embodiment illustrated in FIG. 21, the package substrate 206 may include at least one conductive bump 230 and an underfill layer 240. The pixel driving integrated circuit 406 and the package substrate 206 may be connected through the at least one conductive bump 230. The pixel driving integrated circuit 406 may be fixed by the underfill layer 240. The structure illustrated in FIG. 22B may be referred to as a package on package (PoP) structure or an IC recessed structure.

Figure 23A:
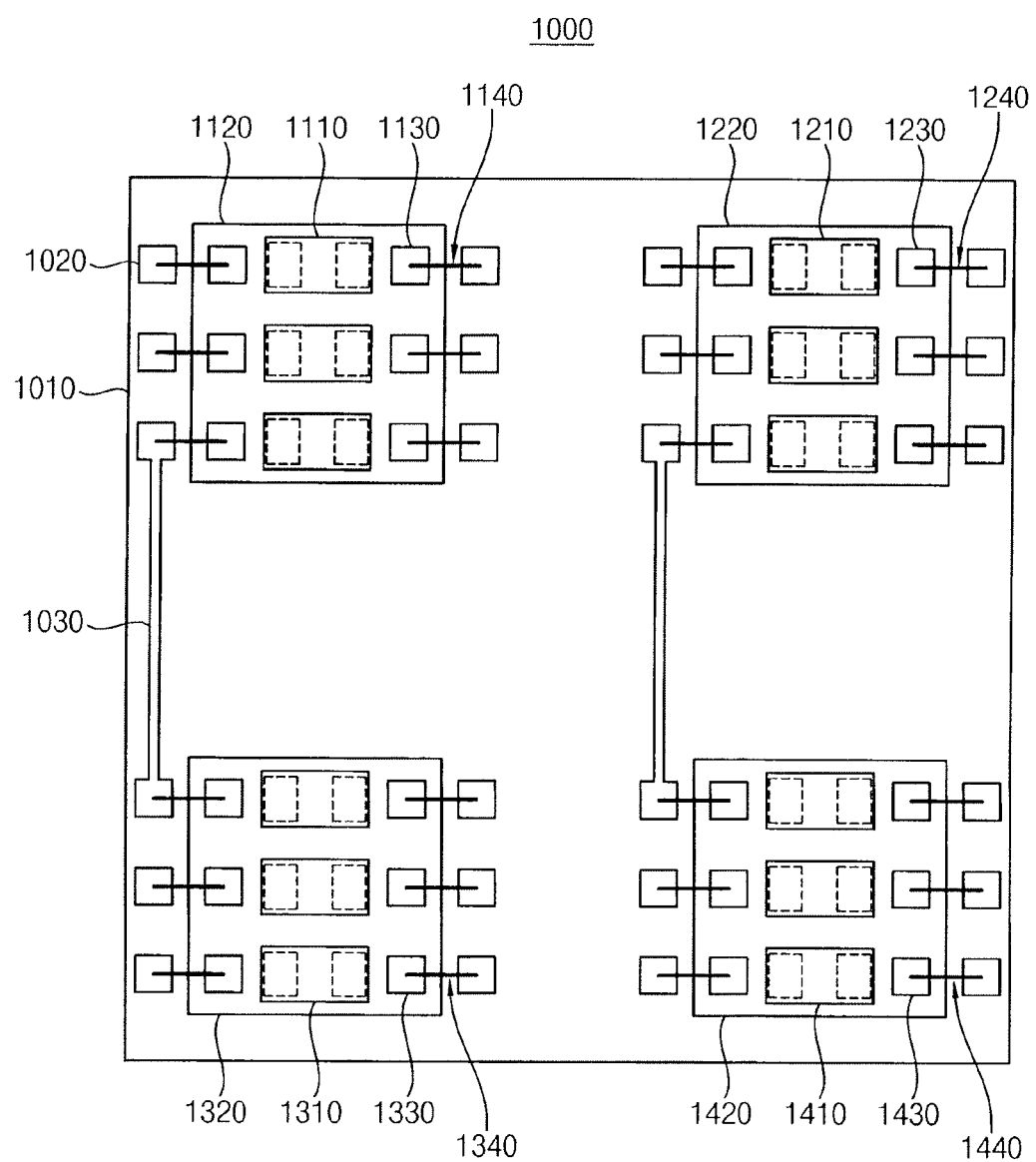
FIGS. 23A, 23B and 23C illustrate a plan view, a bottom view and a cross-sectional view of a light emitting device package according to an example embodiment.
Figure 23B:
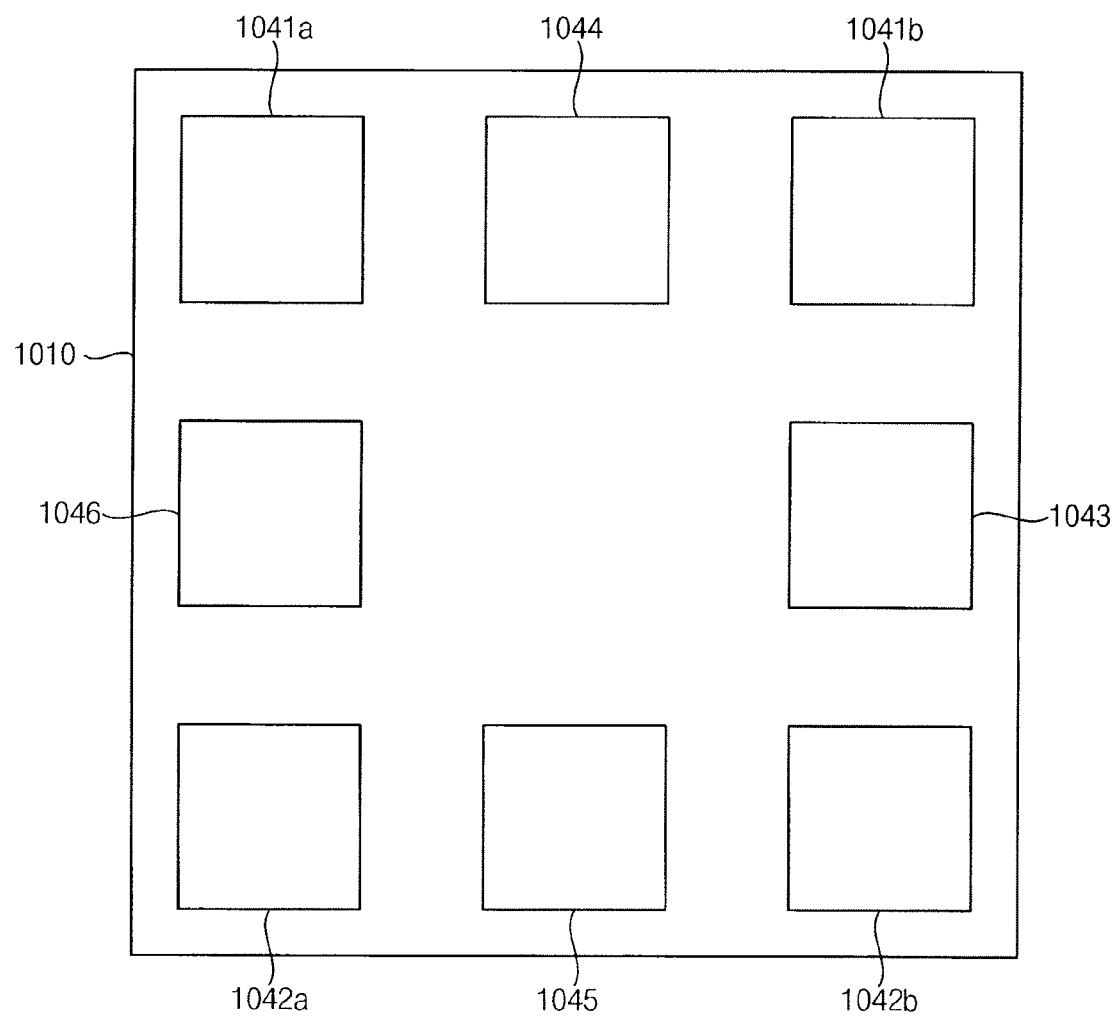
Figure 23C:
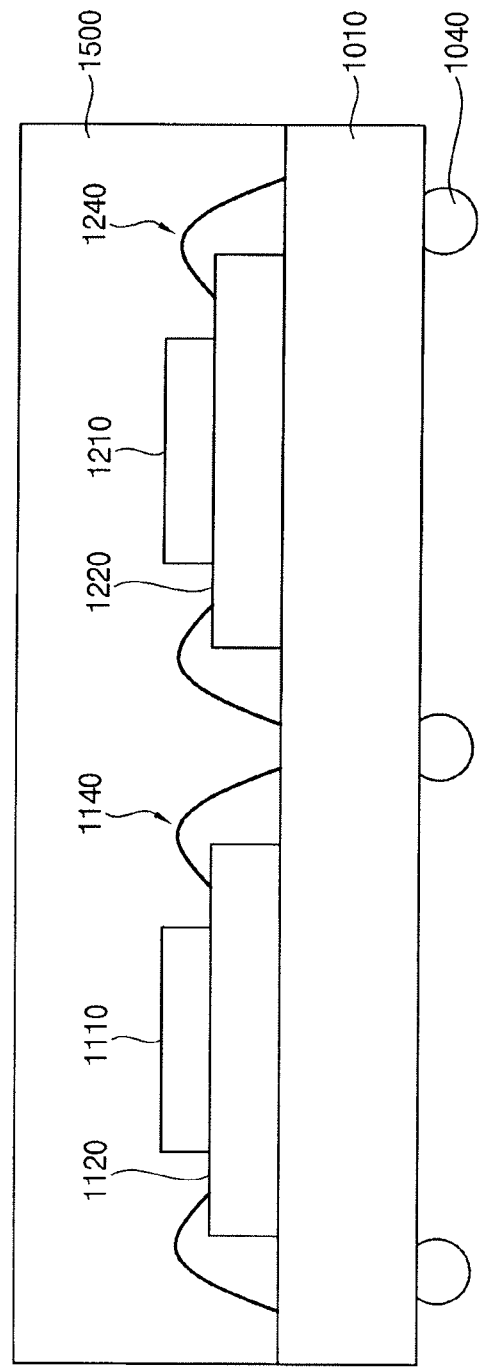

FIGS. 23A, 23B, and 23C are a plan view, a bottom view, and a cross-sectional view of a light emitting device package according to an example embodiment. Descriptions of elements set forth above with respect to FIGS. 1, 2A, and 2B may not be repeated.

Referring to FIGS. 23A, 23B, and 23C, a light emitting device package 1000 may include light emitting diode pixels including light emitting diode chips 1110, 1210, 1310, and 1410, and pixel driving integrated circuits 1120, 1220, 1320, and 1420. The light emitting device package 1000 may further include a package substrate 1010, a sealing member 1500, and bonding wires 1140, 1240, 1340, and 1440.

Different from the light emitting device package 100 of FIG. 1 having a single structure in which one light emitting diode pixel and one pixel driving integrated circuit 400 are formed on one package substrate 200, the plurality of light emitting diode pixels and the plurality of pixel driving integrated circuits 1120, 1220, 1320, and 1420 may be formed or disposed on one package substrate 1010 in the light emitting device package 1000 of FIG. 23A. For example, the example embodiment illustrated in FIG. 23A illustrates a 4-in-1 structure in which four light emitting diode pixels are formed on one package substrate 1010. Other example embodiments may be extended to an M-in-1 structure in which M light emitting diode pixels are formed on one package substrate, where M is a natural number greater than or equal to two.

The package substrate 1010, and pads 1020, and conductive bumps 1040 included therein in FIG. 23A may correspond to the package substrate 200, and the pads 210a-210f and the conductive bumps 220 included therein in FIG. 1, respectively. The light emitting diode chips 1110, 1210, 1310, and 1410 in FIG. 23A may correspond to the light emitting diode chips 300 in FIG. 1. The pixel driving integrated circuits 1120, 1220, 1320, and 1420, and pads 1130, 1230, 1330, and 1430 included therein in FIG. 23A may correspond to the pixel driving integrated circuit 400 and the pads 410a-410f included therein in FIG. 1, respectively. The bonding wires 1140, 1240, 1340, and 1440 in FIG. 23A may correspond to the bonding wires BW1-BW6 in FIG. 1.

As illustrated in FIG. 23B, the number of lower pins of the package substrate 1010 may be reduced by employing the above-described 4-in-1 structure, and thus data processing may be performed with higher resolution and higher speed. Lower pins 1041a and 1041b may be data input/output (I/O) pins for the pixel driving integrated circuits 1120 and 1320. Lower pins 1042a and 1042b may be data input/output pins for the pixel driving integrated circuits 1220 and 1420.

Lower pins 1043, 1044, 1045, and 1046 may be a power pin, a first clock pin, a second clock pin, and a ground pin, respectively, for the pixel driving integrated circuits 1120, 1220, 1320, and 1420. A data output terminal of the pixel driving integrated circuit 1120 and a data input terminal of the pixel driving integrated circuit 1320 may be connected, and a data output terminal of the pixel driving integrated circuit 1220 and a data input terminal of the pixel driving integrated circuit 1420 may be connected by connection lines 1030 included in the package substrate 1010.

In addition, as illustrated in FIG. 23C, the package substrate 1010, the light emitting diode pixels including the light emitting diode chips 1110, 1210, 1310, and 1410, and the pixel driving integrated circuits 1120, 1220, 1320, and 1420 may be fixed by the sealing member 1500.

Although not illustrated in FIG. 23B, in some example embodiments, the lower pins 1041a and 1041b, which are the data input pins, may be implemented as one data input pin, and the lower pins 1042a and 1042b, which are the data output pins, may be implemented as one data output pin.

Figure 24A:
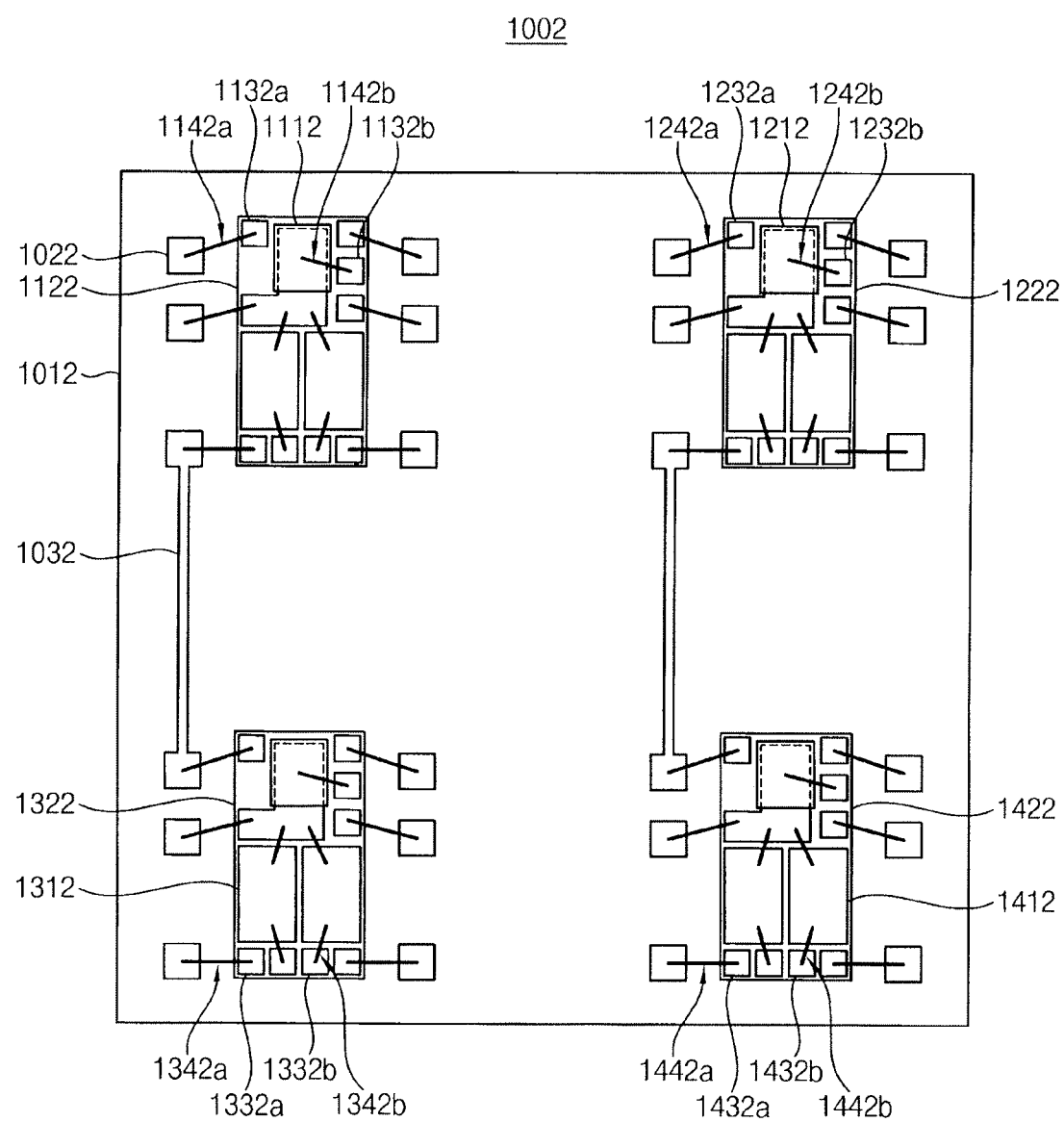
FIGS. 24A and 24B illustrate a plan view and a cross-sectional view of a light emitting device package according to an example embodiment.
Figure 24B:
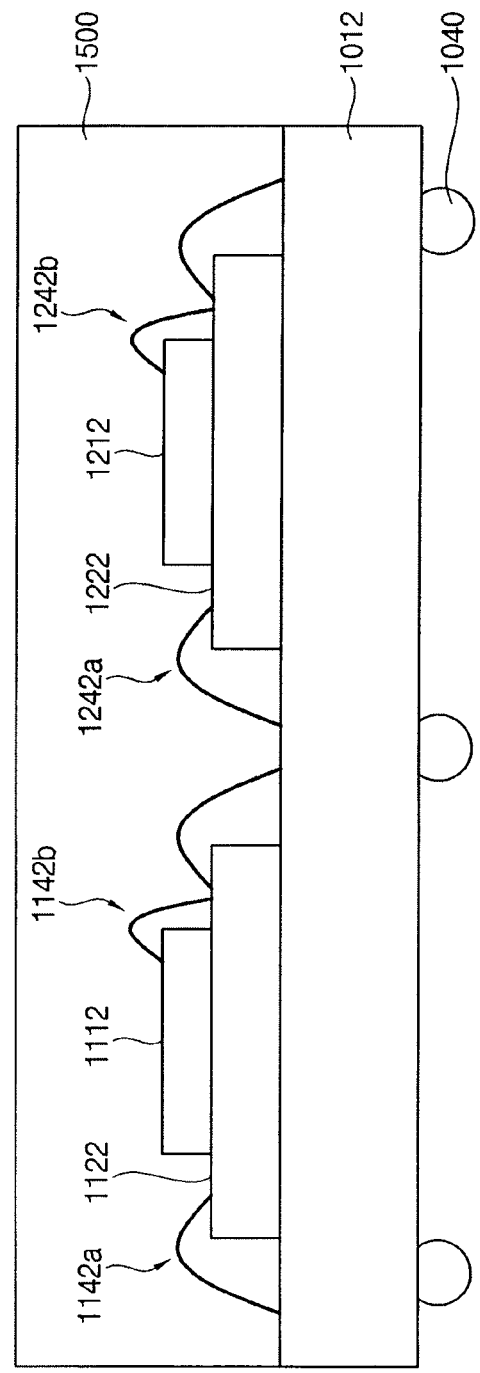

FIGS. 24A and 24B are a plan view and a cross-sectional view of a light emitting device package according to an example embodiment. Descriptions of elements set forth above with respect to FIGS. 17, 18A, 18B, 23A, 23B, and 23C may not be repeated.

Referring to FIGS. 24A and 24B, a light emitting device package 1002 represents an example where the light emitting device package 102 of FIG. 17 is implemented as the 4-in-1 structure. Among elements included in the light emitting device package 1002, a package substrate 1012, and pads 1022 and conductive bumps 1040 included therein in FIG. 24A may correspond to the package substrate 202, and the pads 210a-210f and the conductive bumps 220 included therein in FIG. 17, respectively. Light emitting diode chips 1112, 1212, 1312, and 1412 in FIG. 24A may correspond to the light emitting diode chips 302 in FIG. 17. Pixel driving integrated circuits 1122, 1222, 1322, and 1422, and pads 1132a, 1232a, 1332a, 1432a, 1132b, 1232b, 1332b, and 1432b included therein in FIG. 24A may correspond to the pixel driving integrated circuit 402 and the pads 410a-410f and 412a-412c included therein in FIG. 17, respectively. Bonding wires 142a, 1242a, 1342a, 1442a, 1142b, 1242b, 1342b, and 1442b in FIG. 24A may correspond to the bonding wires BW11-BW16 and BW21~BW25 in FIG. 17. Connection lines 1032 in FIG. 24A may be substantially the same as the connection lines 1030 in FIG. 23A.

Figure 25A:
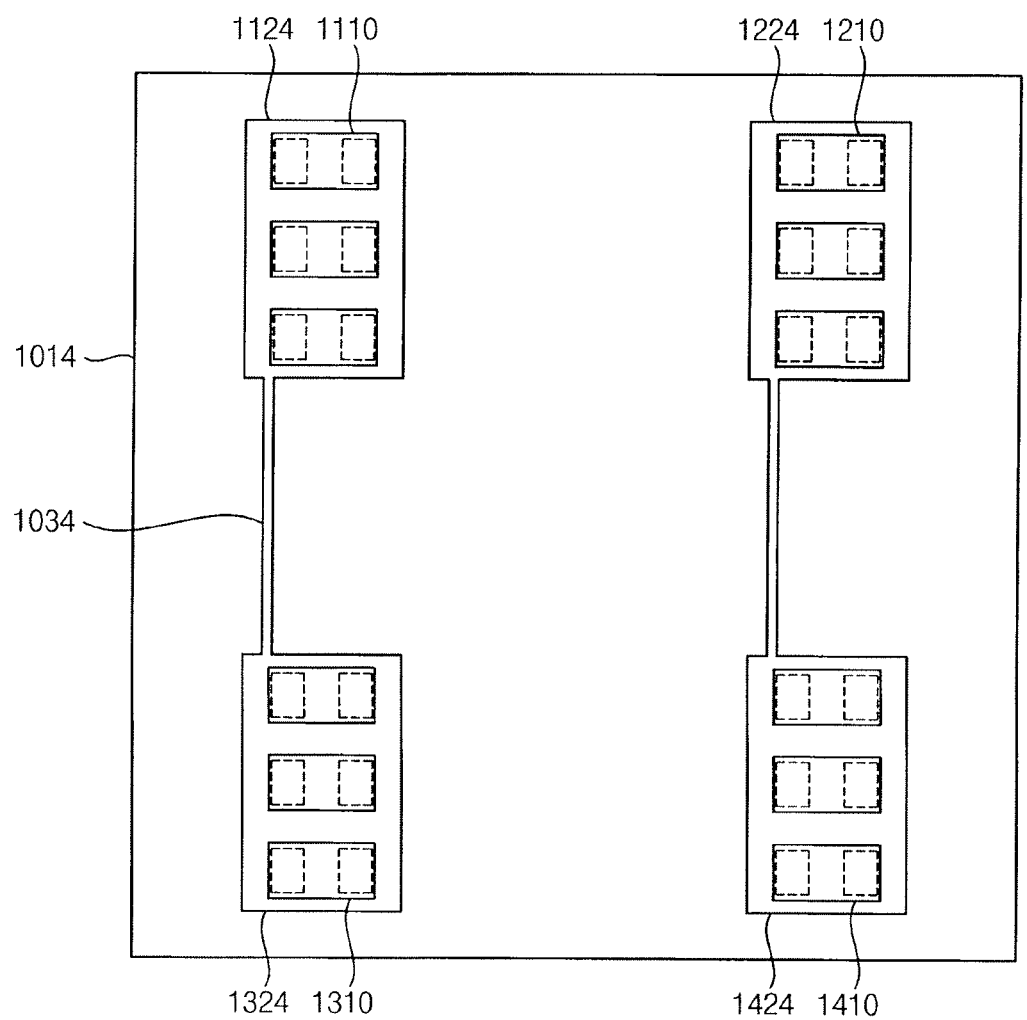
FIGS. 25A and 25B illustrate a plan view and a cross-sectional view of a light emitting device package according to an example embodiment.
Figure 25B:
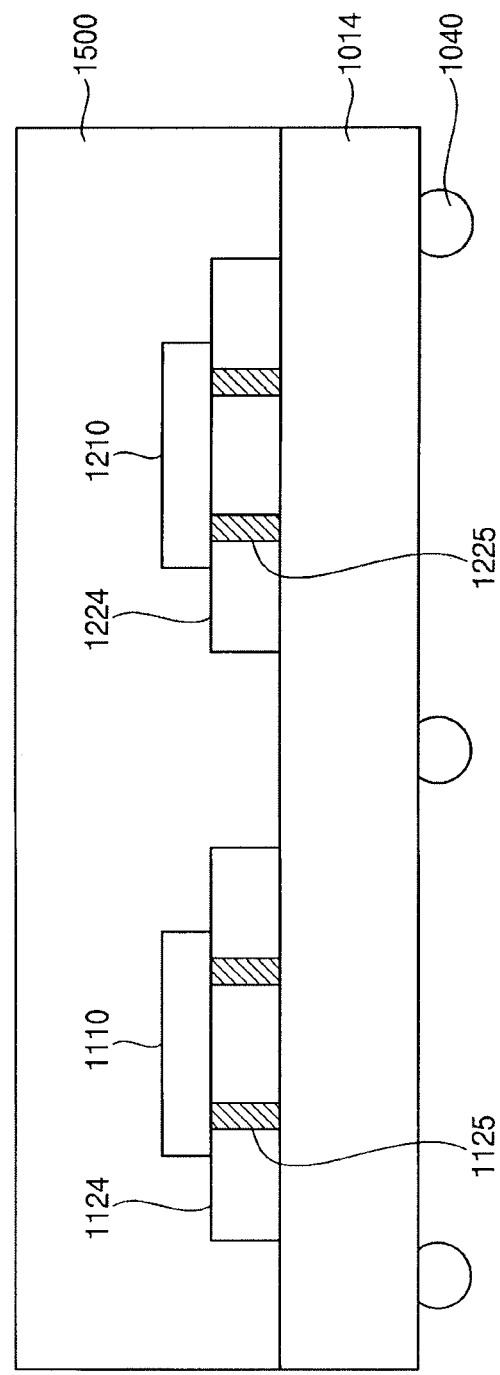

FIGS. 25A and 25B are a plan view and a cross-sectional view of a light emitting device package according to an example embodiment. Descriptions of elements set forth above with respect to FIGS. 19, 20A, 20B, 23A, 23B, and 23C may not be repeated.

Referring to FIGS. 25A and 25B, a light emitting device package 1004 may represent an example where the light emitting device package 104 of FIG. 19 is implemented as the 4-in-1 structure. Among elements included in the light emitting device package 1004, a package substrate 1014 and conductive bumps 1040 included therein in FIG. 25A may correspond to the package substrate 204 and the conductive bumps 220 included therein in FIG. 19, respectively. Light emitting diode chips 1110, 1210, 1310, and 1410 in FIG. 25A may correspond to the light emitting diode chips 300 in FIG. 19. Pixel driving integrated circuits 1124, 1224, 1324, and 1424, and through silicon vias 1125 and 1225 included therein in FIG. 25A may correspond to the pixel driving integrated circuit 404 and the through silicon vias 405 included therein in FIG. 19, respectively. Connection lines 1034 in FIG. 25A may be substantially the same as the connection lines 1030 in FIG. 23A.

Figure 26A:
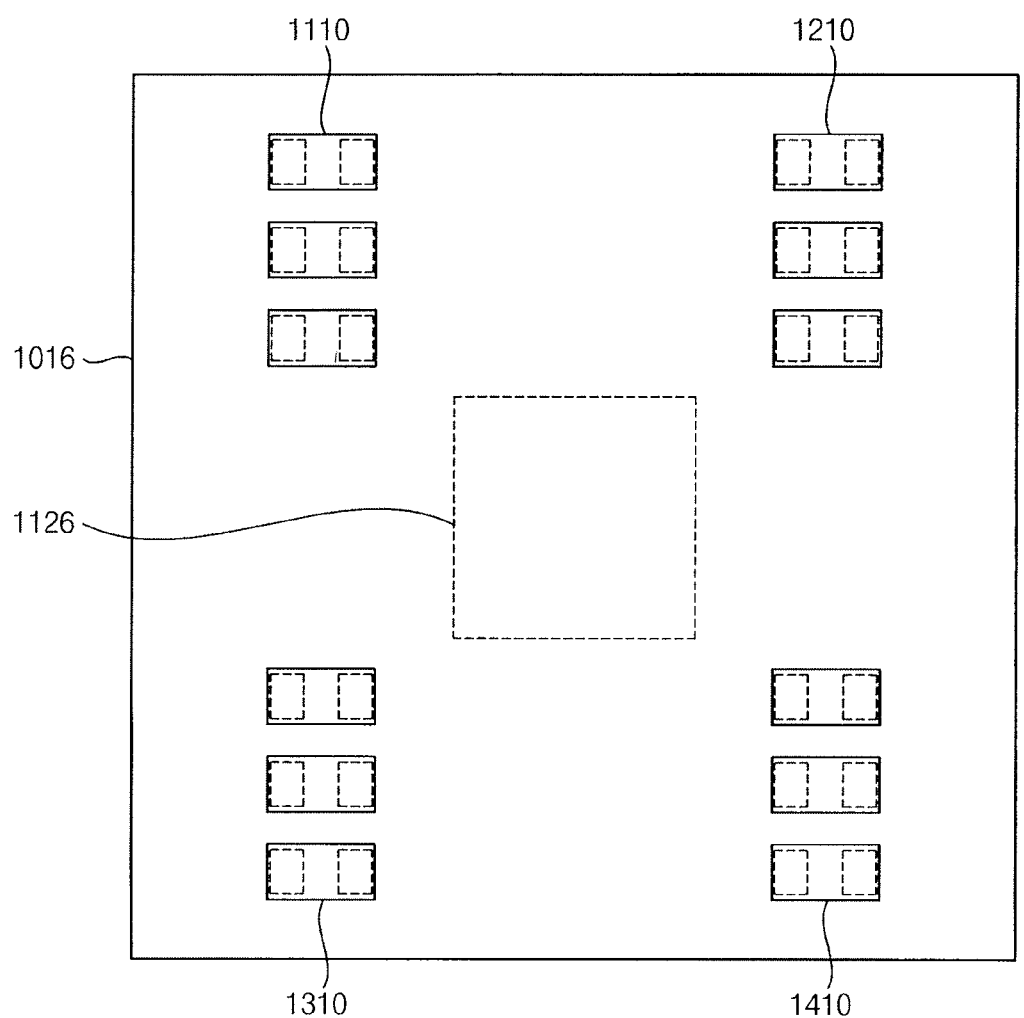
FIGS. 26A and 26B illustrate a plan view and a cross-sectional view of a light emitting device package according to an example embodiment.
Figure 26B:
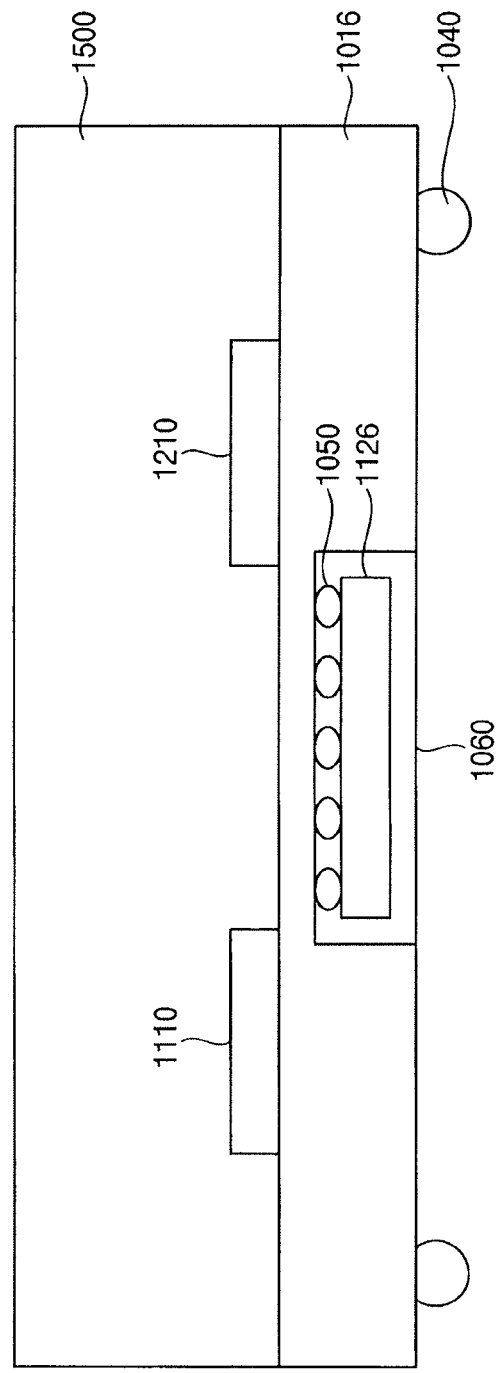

FIGS. 26A and 26B are a plan view and a cross-sectional view of a light emitting device package according to an example embodiment. Descriptions of elements set forth above with respect to FIGS. 21, 22A, 22B, 23A, 23B, and 23C may not be repeated.

Referring to FIGS. 26A and 26B, a light emitting device package 1006 may represent an example where the light emitting device package 106 of FIG. 21 is implemented as the 4-in-1 structure. Among elements included in the light emitting device package 1006, a package substrate 1016, and conductive bumps 1040 and 1050 and an underfill layer 1060 included therein in FIG. 26A may correspond to the package substrate 206, and the conductive bumps 220 and 230 and the underfill layer 240 included therein in FIG. 21, respectively. Light emitting diode chips 1110, 1210, 1310, and 1410 in FIG. 26A may correspond to the light emitting diode chips 300 in FIG. 21. Pixel driving integrated circuit 1126 in FIG. 26A may correspond to the pixel driving integrated circuit 406 in FIG. 21.

In the example embodiment illustrated in FIG. 26A, the pixel driving integrated circuit 1126 may drive all of the light emitting diode chips 1110, 1210, 1310, and 1410 based on the active matrix scheme and the pulse width modulation scheme. Thus, the pixel driving integrated circuit 1126 may be shared by light emitting diode pixels that are included in the light emitting device package 1006 and include the light emitting diode chips 1110, 1210, 1310, and 1410.

Figure 27:
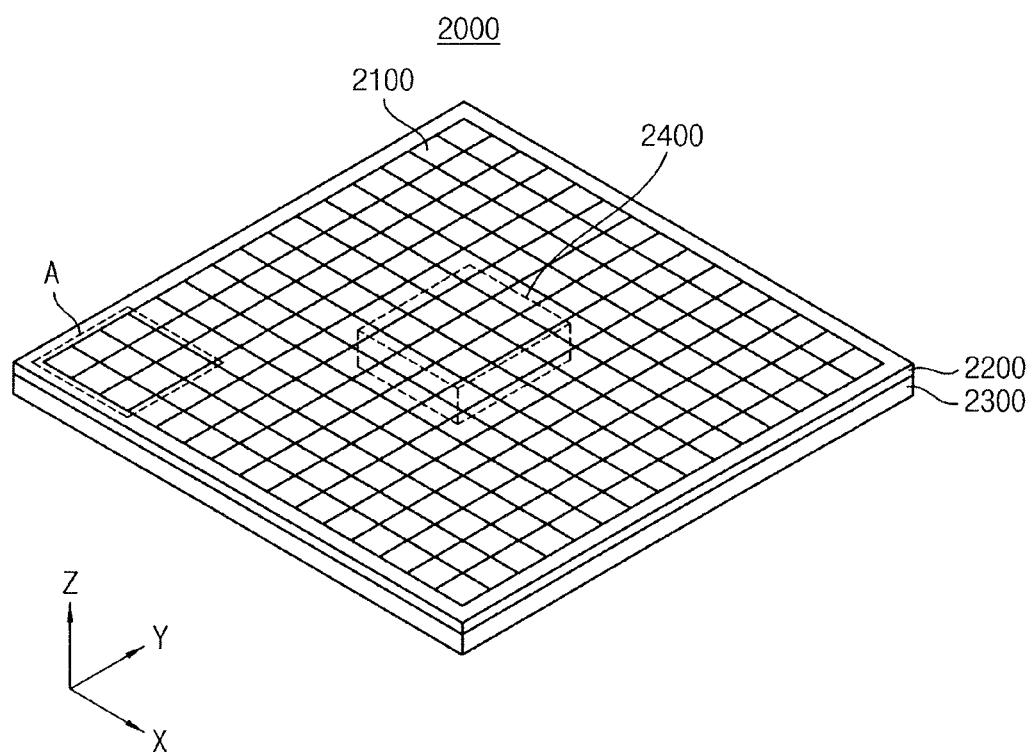
FIG. 27 illustrates a perspective view of a display device according to an example embodiment.
Figure 28:
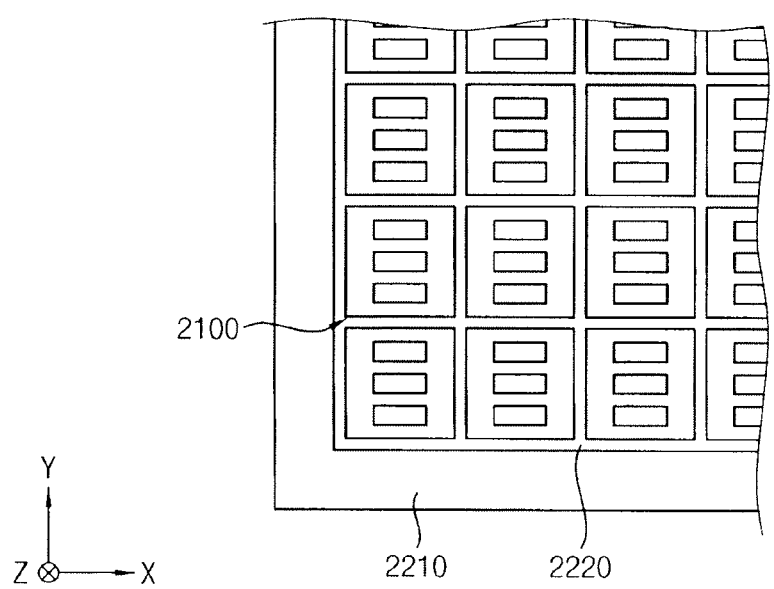
FIG. 28 illustrates an enlarged view of a portion "A" in FIG. 27.
Figure 29:
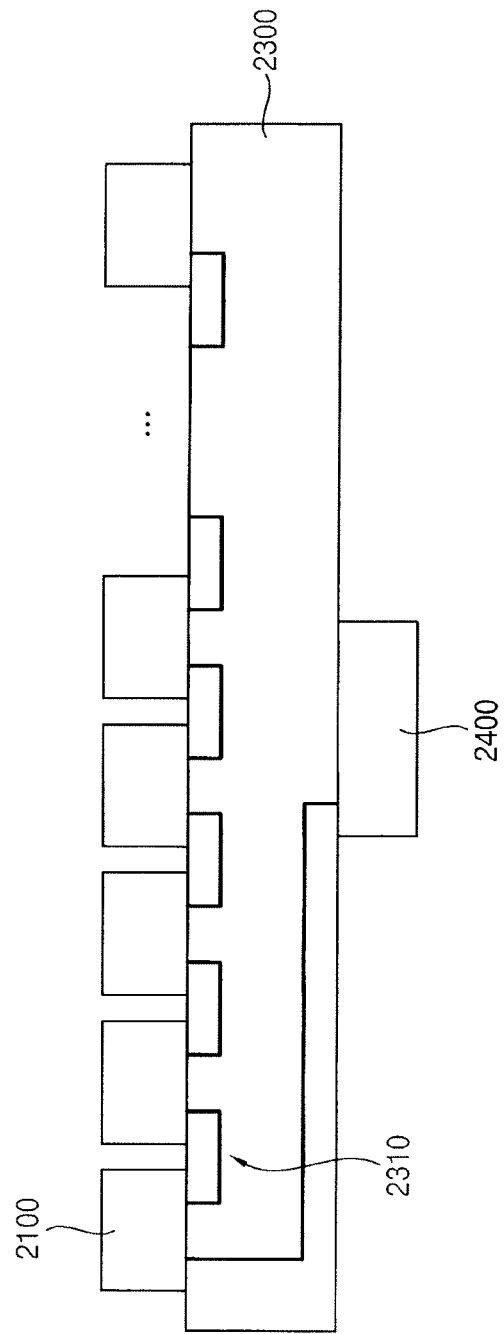
FIG. 29 illustrates a cross-sectional view of a display device of FIG. 27.

FIG. 27 is a perspective view of a display device according to an example embodiment. FIG. 28 is an enlarged view of a portion "A" in FIG. 27. FIG. 29 is a cross-sectional view of a display device of FIG. 27.

Referring to FIG. 27, a display device 2000 may include a light emitting device module 2200 including a plurality of light emitting device packages 2100, a printed circuit board 2300, and a controller 2400.

The plurality of light emitting device packages 2100 may be disposed on a first surface of the printed circuit board 2300. Each of the plurality of light emitting device packages 2100 may be the light emitting device package according to an example embodiment. Each of the plurality of light emitting device packages 2100 may form a single pixel of the display device 2000, and may be arranged on the printed circuit board 2300 in rows and columns (for example, along X and Y directions). Although FIG. 27 illustrates that the light emitting device packages 2100 are arranged in a 15*15 array in a matrix formation, greater or lesser numbers of light emitting device packages may be arranged (for example, 1024*768, 1920*1080, etc.) according to a desired resolution.

The controller 2400 may be disposed on a second surface of the printed circuit board 2300 opposite to the first surface of the printed circuit board 2300. The controller 2400 may control driving of the plurality of light emitting device packages 2100. For example, the controller 2400 may provide data and/or signals for driving a pixel driving control circuit included in each of the plurality of light emitting device packages 2100. Although FIG. 27 illustrates one controller 2400, a plurality of controllers may be disposed on the second surface. The number of controllers may be determined based on the total number of the light emitting device packages 2100 and the number of light emitting device packages driven by one controller.

Referring to FIG. 28, the display device 2000 may further include a first partition structure 2210 that surrounds an area in which the plurality of light emitting device packages 2100 are disposed on the printed circuit board 2300. In addition, each of the light emitting device packages 2100 may be surrounded by a second partition structure 2220. The second partition structure 2220 may electrically isolate each of the light emitting device packages 2100 from each other such that each of the light emitting device packages 2100 is independently driven as a single pixel. In an example embodiment, the first partition structure 2210 and the second partition structure 2220 may include a black matrix, and/or at least one of the first partition structure 2210 and the second partition structure 2220 may be omitted.

Referring to FIG. 29, the light emitting device packages 2100 disposed in the same row or column may be connected in series through wirings 2310 in the printed circuit board 2300. Thus, each of the light emitting device packages 2100 may obtain (for example, extract) only frame data for itself from serial data for one frame interval provided from the controller 2400, and may transfer the remaining data to a next or subsequent light emitting device package.

By way of summation and review, semiconductor light emitting diodes (LEDs) may be used as light sources for lighting devices as well as light sources for various electronic products. For example, semiconductor LEDs may be used as light sources in the display panels of various devices, such as televisions (TVs), mobile phones, personal computers (PCs), laptop computers, and personal digital assistants (PDAs).

Display devices that do not require separate backlights may use LED devices for individual pixels. Such display devices may not only be compact, but may also emit a relatively high luminance with good efficiency. In addition, because the aspect ratio of a display screen may be freely changed and may be implemented to have a large area, such display devices may be provided as large displays.

As described above, embodiments may provide a light emitting device package capable of efficiently driving with an active matrix (AM) scheme.

As described above, in a light emitting device package and a display device according to an example embodiment, a pixel driving integrated circuit for driving light emitting diode chips based on an active matrix scheme and a pulse width modulation scheme may be included in each package. Thus, the active matrix scheme may be efficiently implemented, and ghost and flicker, which may arise when using a passive matrix scheme, may be effectively reduced and/or removed. In addition, the pixel driving integrated circuit may be disposed under the light emitting diode chips. Thus, light emitted from the light emitting diode chips may not be blocked by the pixel driving integrated circuit, thereby preventing a decrease in luminous efficiency or emission efficiency.

Embodiments may provide a display device including the light emitting device package.

Embodiments may be applied to display devices, backlight devices, lighting devices, etc., and various electronic devices and/or systems that include the light emitting device packages.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated.

Accordingly, it will be understood by those of skill in the art that various changes in form and details may be made without departing from the spirit and scope of the present invention as set forth in the following claims.

What is claimed is:

1. A light emitting device package, comprising: a first light emitting diode pixel, the first light emitting diode pixel including first light emitting diode chips that each emit light; and a first pixel driving integrated circuit under the first light emitting diode chips of the first light emitting diode pixel, the first pixel driving integrated circuit configured to drive the first light emitting diode chips based on an active matrix scheme, in which each of the first light emitting diode chips is driven using an entire one frame interval, and based on a pulse width modulation scheme, in which a time during which each of first driving currents is applied to a respective one of the first light emitting diode chips is controlled within the entire one frame interval; wherein the first pixel driving integrated circuit includes: a de-multiplexer configured to receive serial data from an external controller, to extract first frame data for the first light emitting diode chips from the serial data, and to distribute the first frame data to output distributed first frame data; a storage configured to store the distributed first frame data; a constant current generator configured to generate a reference current based on a power supply voltage; and a pulse width modulation data generator configured to generate the first driving currents applied to the first light emitting diode chips based on a clock signal, a pulse width modulation clock signal, the distributed first frame data provided from the storage, and the reference current provided from the constant current generator.

2. The light emitting device package as claimed in claim 1, wherein the first pixel driving integrated circuit is configured to: during a first frame interval, receive and distribute the first frame data to store the distributed first frame data into the storage, and during a second frame interval subsequent to the first frame interval, generate the first driving currents based on the distributed first frame data, and receive and distribute second frame data to store the distributed second frame data into the storage.

3. The light emitting device package as claimed in claim 1, wherein the first pixel driving integrated circuit further includes: a data input pad configured to receive the serial data; a data output pad configured to output remaining data other than the first frame data among the serial data; a power pad configured to receive the power supply voltage; a first clock pad configured to receive the clock signal; a second clock pad configured to receive the pulse width modulation clock signal; and a ground pad connected to the first light emitting diode chips.

4. The light emitting device package as claimed in claim 3, further comprising:
an electrostatic discharge protection circuit connected to the power pad.

5. The light emitting device package as claimed in claim 1, wherein: the storage is configured to further store characteristic data associated with the first light emitting diode chips, and the first pixel driving integrated circuit further includes a compensator configured to control the first driving currents based on the characteristic data.

6. The light emitting device package as claimed in claim 5, wherein the compensator is configured to control duty ratios of the first driving currents based on the characteristic data.

7. The light emitting device package as claimed in claim 5, wherein the compensator is configured to control current levels of the first driving currents based on the characteristic data.

8. The light emitting device package as claimed in claim 1, wherein the first pixel driving integrated circuit further includes an oscillator configured to generate the pulse width modulation clock signal based on the clock signal.

9. The light emitting device package as claimed in claim 8, wherein the first pixel driving integrated circuit further includes:
a data input pad configured to receive the serial data;
a data output pad configured to output remaining data other than the first frame data among the serial data;
a power pad configured to receive the power supply voltage;
a first clock pad configured to receive the clock signal; and
a ground pad connected to the first light emitting diode chips.

10. The light emitting device package as claimed in claim 1, wherein: the first frame data further includes clock data, and the first pixel driving integrated circuit further includes a clock generator configured to generate the clock signal and the pulse width modulation clock signal based on the clock data.

11. The light emitting device package as claimed in claim 10, wherein the first pixel driving integrated circuit further includes:
a data input pad configured to receive the serial data;
a data output pad configured to output remaining data other than the first frame data among the serial data;
a power pad configured to receive the power supply voltage; and
a ground pad connected to the first light emitting diode chips.

12. The light emitting device package as claimed in claim 1, further comprising:
a second light emitting diode pixel, the second light emitting diode pixel including second light emitting diode chips that each emit light; and
a second pixel driving integrated circuit under the second light emitting diode chips of the second light emitting diode pixel, the second pixel driving integrated circuit configured to drive the second light emitting diode chips based on the active matrix scheme and based on the pulse width modulation scheme.

13. The light emitting device package as claimed in claim 12, further comprising a package substrate under the first pixel driving integrated circuit and the second pixel driving integrated circuit, wherein the package substrate, the first light emitting diode pixel, the first pixel driving integrated circuit, the second light emitting diode pixel, and the second pixel driving integrated circuit are fixed by one sealing member.

14. The light emitting device package as claimed in claim 1, further comprising a second light emitting diode pixel including second light emitting diode chips that each emit light, wherein the first pixel driving integrated circuit is further configured to drive the second light emitting diode chips based on the active matrix scheme and based on the pulse width modulation scheme.

15. The light emitting device package as claimed in claim 14, further comprising a package substrate between the first and second light emitting diode chips and the first pixel driving integrated circuit, wherein:

the first and second light emitting diode chips and the package substrate are directly connected through at least one electrode, and the first pixel driving integrated circuit and the package substrate are connected through at least one conductive bump.

16. The light emitting device package as claimed in claim 1, wherein the first light emitting diode chips include one or more of a red light emitting diode chip that emits red light, a green light emitting diode chip that emits green light, and a blue light emitting diode chip that emits blue light.

17. The light emitting device package as claimed in claim 1, wherein the first light emitting diode chips include a white light emitting diode chip that emits white light.

18. A display device, comprising:
a printed circuit board;
a plurality of light emitting device packages on a first surface of the printed circuit board; and
a controller on a second surface of the printed circuit board opposite to the first surface of the printed circuit board, the controller configured to control driving of the plurality of light emitting device packages,
wherein each of the plurality of light emitting device packages includes:
a first light emitting diode pixel, the first light emitting diode pixel including first light emitting diode chips that each emit light; and
a first pixel driving integrated circuit under the first light emitting diode chips of the first light emitting diode pixel, the first pixel driving integrated circuit configured to drive the first light emitting diode chips based on an active matrix scheme, in which each of the first light emitting diode chips is driven using an entire one frame interval, and based on a pulse width modulation scheme, in which a time during which each of first driving currents is applied to a respective one of the first light emitting diode chips is controlled within the entire one frame interval, wherein the first pixel driving integrated circuit includes:
a demultiplexer configured to receive serial data from the controller, to extract first frame data for the first light emitting diode chips from the serial data, and to distribute the first frame data to output distributed first frame data;
a storage configured to store the distributed first frame data;
a constant current generator configured to generate a reference current based on a power supply voltage; and
a pulse width modulation data generator configured to generate the first driving currents applied to the first light emitting diode chips based on a clock signal, a pulse width modulation clock signal, the distributed first frame data provided from the storage, and the reference current provided from the constant current generator.

19. A light emitting device package, comprising:
a first light emitting diode pixel, the first light emitting diode pixel including first light emitting diode chips that each emit light;
a first pixel driving integrated circuit under the first light emitting diode chips of the first light emitting diode pixel, the first pixel driving integrated circuit and the first light emitting diode chips being directly connected through at least one electrode, the first pixel driving integrated circuit configured to drive the first light emitting diode chips based on an active matrix scheme, in which each of the first light emitting diode chips is driven using an entire one frame interval, and based on a pulse width modulation scheme, in which a time during which each of first driving currents is applied to a respective one of the first light emitting diode chips is controlled within the entire one frame interval; and
a package substrate on which the first light emitting diode chips and the first pixel driving integrated circuit are mounted, the package substrate and the first pixel driving integrated circuit being connected through at least one bonding wire,
wherein the first pixel driving integrated circuit includes:
a demultiplexer configured to receive serial data from an external controller, to extract first frame data for the first light emitting diode chips from the serial data, and to distribute the first frame data to output distributed first frame data;
a storage configured to store the distributed first frame data;
a constant current generator configured to generate a reference current based on a power supply voltage;
a pulse width modulation data generator configured to generate the first driving currents applied to the first light emitting diode chips based on a clock signal, a pulse width modulation clock signal, the distributed first frame data provided from the storage, and the reference current provided from the constant current generator;
a data input pad configured to receive the serial data;
a data output pad configured to output remaining data other than the first frame data among the serial data;
a power pad configured to receive the power supply voltage;
a first clock pad configured to receive the clock signal;
a second clock pad configured to receive the pulse width modulation clock signal; and
a ground pad connected to the first light emitting diode chips.

* * * * *